United States Patent
Bisplinghoff

(10) Patent No.: US 9,537,513 B2
(45) Date of Patent: Jan. 3, 2017

(54) RATE ADAPTIVE TURBO FORWARD ERROR CORRECTION

(71) Applicant: Cisco Technology, Inc., San Jose, CA (US)

(72) Inventor: Andreas Bisplinghoff, Forchheim (DE)

(73) Assignee: Cisco Technology, Inc., San Jose, CA (US)

( * ) Notice: Subject to any disclaimer, the term of this patent is extended or adjusted under 35 U.S.C. 154(b) by 52 days.

(21) Appl. No.: 14/704,377

(22) Filed: May 5, 2015

(65) Prior Publication Data

US 2015/0326252 A1 Nov. 12, 2015

(30) Foreign Application Priority Data

May 7, 2014 (GB) .................................. 1408024.6
Jan. 15, 2015 (GB) .................................. 1500611.7

(51) Int. Cl.
*H03M 13/00* (2006.01)
*H03M 13/35* (2006.01)
(Continued)

(52) U.S. Cl.
CPC ......... *H03M 13/353* (2013.01); *H03M 13/258* (2013.01); *H04L 1/005* (2013.01);
(Continued)

(58) Field of Classification Search
CPC ... H03M 13/258; H03M 13/353; H04L 27/18; H04L 27/04; H04L 27/2332; H04L 1/005; H04L 1/0044
See application file for complete search history.

(56) References Cited

U.S. PATENT DOCUMENTS 6,195,396 B1 2/2001 Fang et al.
6,370,202 B1 4/2002 Wolcott
(Continued)

FOREIGN PATENT DOCUMENTS

EP          1032150 A2    8/2000
WO    2010/048984 A1    5/2010
WO    2012/175636 A1   12/2012

OTHER PUBLICATIONS

Franceschini et al., "A Novel Class of Low-Complexity SISO Algorithms for Phase-Uncertain Communications", IEEE, Information Theory, 2005. ISIT 2005. Proceedings. International Symposium on, Sep. 2005, 5 pages.

(Continued)

*Primary Examiner* — Sam Rizk
(74) *Attorney, Agent, or Firm* — Edell, Shapiro & Finnan, LLC

(57) ABSTRACT

Techniques herein support enhanced multi-rate encoding and decoding of signals in multiple formats. In one embodiment, input data is received at a first device at one of a plurality of data rates. Encoder units are activated to produce streams of encoded input data. The encoder units are configured to operate at the same data rate. Differential encoding operations are performed to produce an encoded output stream. The encoded output stream is modulated for transmission to a second device. In another embodiment, a first device receives an encoded data stream that is transmitted from a second device. The modulated data stream includes encoded data at one of a plurality of data rates. Differential decoding is performed on the encoded data by activating one or more of a plurality of decoder units, where each of the plurality of decoder units is configured to operate at the same rate.

8 Claims, 15 Drawing Sheets

(51) Int. Cl.
*H03M 13/25* (2006.01)
*H04L 27/18* (2006.01)
*H04L 27/04* (2006.01)
*H04L 27/233* (2006.01)
*H04L 27/36* (2006.01)
*H04L 1/00* (2006.01)

(52) U.S. Cl.
CPC ............ *H04L 1/0044* (2013.01); *H04L 27/04* (2013.01); *H04L 27/18* (2013.01); *H04L 27/2332* (2013.01); *H04L 27/362* (2013.01); *H04L 1/0003* (2013.01); *H04L 1/006* (2013.01); *H04L 1/0016* (2013.01)

(56) References Cited

U.S. PATENT DOCUMENTS

2002/0131525 A1 9/2002 Fang
2002/0133644 A1 9/2002 Fang
2003/0067991 A1 4/2003 Okamoto
2011/0261904 A1 10/2011 Seier et al.

OTHER PUBLICATIONS

Franceschini et al., "Serial Concatenation of LDPC Codes and Differential Modulations", IEEE, Journal on Selected Areas in Communications, vol. 23, No. 9, Sep. 2005, pp. 1758-1768.
Franceschini et al., "Detection by Multiple Trellises", IEEE, Transactions on Communications, vol. 57, No. 3, Mar. 2009, pp. 726-737.
Combined Search and Examination Report in counterpart Great Britain Application No. 1408024.6, mailed Oct. 27, 2014, 6 pages.
Combined Search and Examination Report in counterpart Great Britain Application No. 1500611.7, mailed Mar. 13, 2015, 8 pages.
Examination Report in counterpart Great Britain Application No. 1408024.6, mailed Mar. 13, 2015, 3 pages.
Bisplinghoff et al., "Turbo differential decoding failure for a coherent phase slip channel", 2012 38th European Conference and Exhibition on Optical Communications, OSA, Sep. 16, 2012, pp. 1-3, XP032544056.
Extended European Search Report in counterpart European Application No. 15166838.1, dated Sep. 29, 2015, 7 pages.

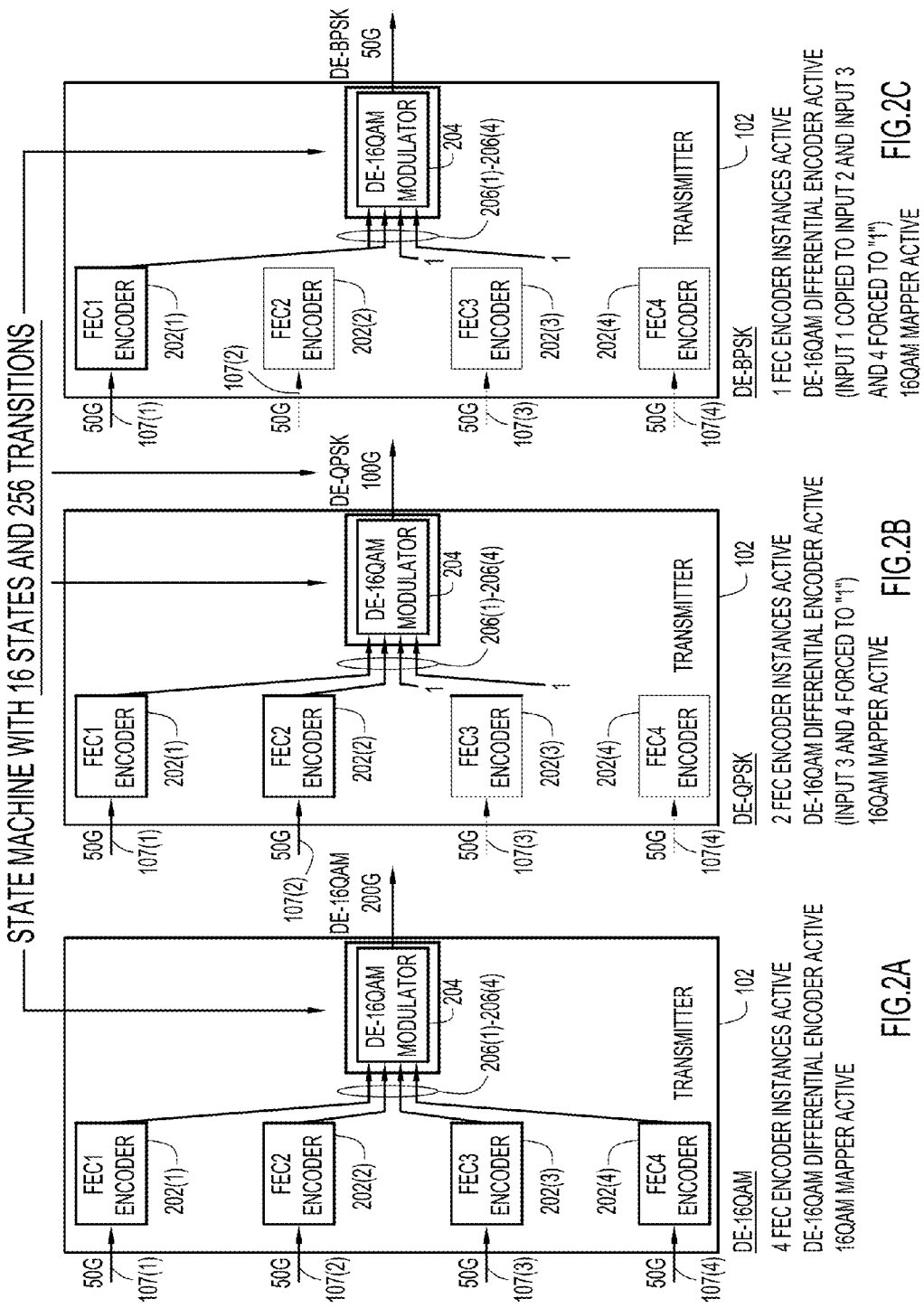

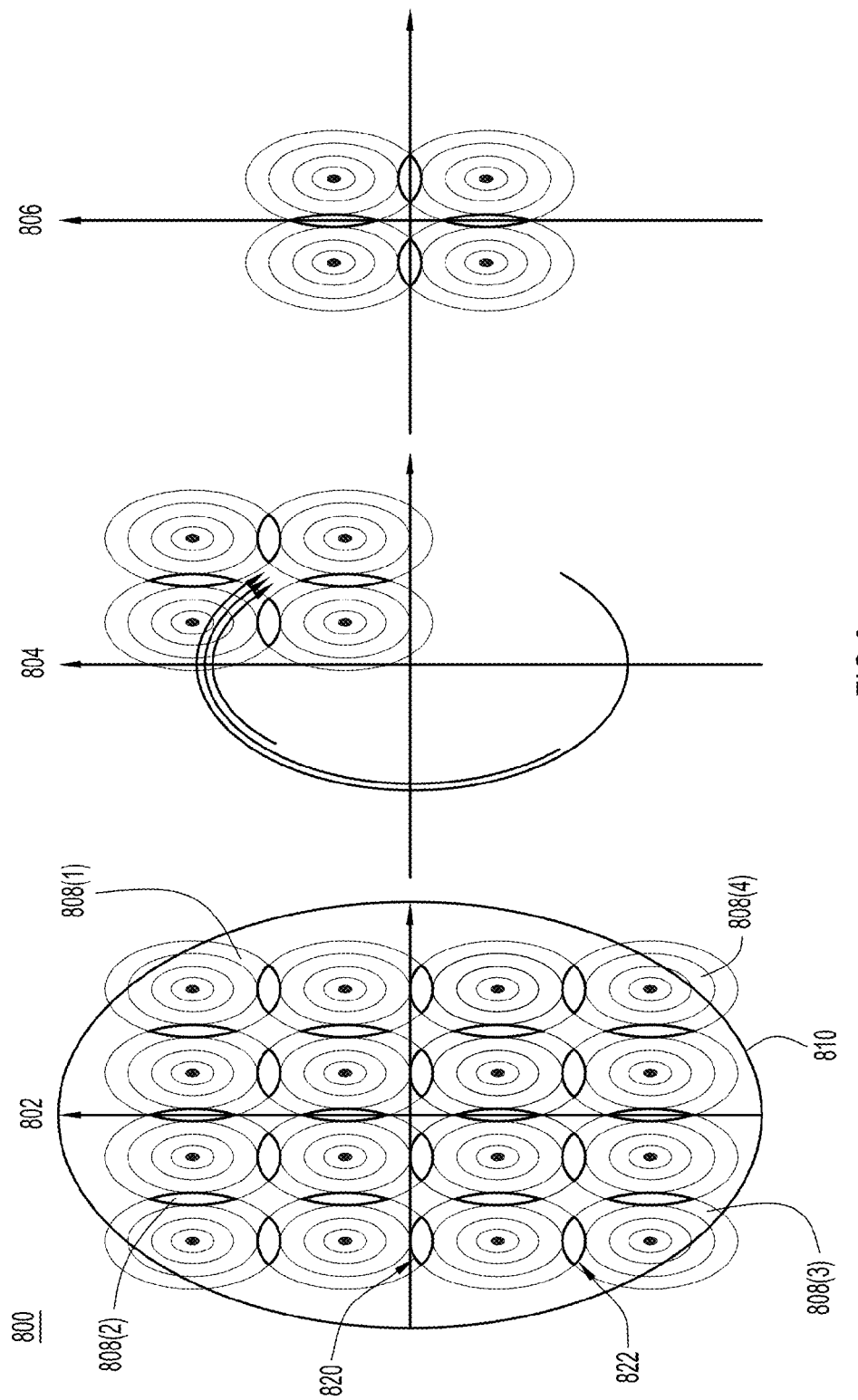

RATE ADAPTIVE TURBO FORWARD ERROR CORRECTION

PRIORITY CLAIM

This application claims priority to British Patent Application No. GB1408024.6, filed May 7, 2014, and to British Patent Application No. GB1500611.7, filed Jan. 15, 2015, the entirety of each of which is incorporated herein by reference.

TECHNICAL FIELD

The present disclosure relates to enhanced data encoding and decoding techniques.

BACKGROUND

Data signals may be sent in many formats between communication devices. For example, devices may encode and modulate data signals of different data rates into several formats, and these data signals may be transmitted across communication channels to other devices in a network. A device may receive the encoded digital data and may equalize and decode the encoded data. For example, data signals may be encoded and decoded in accordance with a Binary Phase Shift Keying (BPSK) format, a Quadrature Phase Shift Keying (QPSK) format, a Quadrature Amplitude Modulation (QAM) format, etc., depending on the data rate desired for communication over a channel. Additionally, data signals may be encoded and decoded using error correction techniques in order to minimize or eliminate errors caused by noise and other distortions in the encoded data signal that may have resulted from transmission and that are not otherwise compensated for in the receiver. An example error correction technique is Forward Error Correction (FEC).

BRIEF DESCRIPTION OF THE DRAWINGS

FIGS. 2A-2C are block diagrams of a first example encoding system configured to encode data at multiple data rates in multiple formats, according to example embodiments.

FIG. 8 shows an example representation of two-stage decoding operations performed on the encoded data signals by the second example decoding system.

DESCRIPTION OF EXAMPLE EMBODIMENTS

Overview

In accordance with example embodiments presented herein, enhanced encoding and decoding processes are provided that implement error correction encoding and decoding techniques which support multiple data rates and multiple modulation formats with reasonable power dissipation. In one embodiment, input data is received at a first device at one of a plurality of data rates. One or more of a plurality of encoder units are activated in the first device based on the data rate of the input data to produce corresponding one or more streams of encoded input data. Each of the plurality of encoder units is configured to operate at the same data rate. Differential encoding operations are performed on the one or more streams of encoded input data to produce an encoded output stream. The encoded output stream is modulated for transmission in a communication channel to a second device.

In another embodiment, a first device receives an encoded data stream that is transmitted over a communication channel from a second device. The encoded data stream includes encoded data at one of a plurality of data rates. Differential decoding is performed on the encoded data to generate one or more streams of decoded data based on the data rate of the encoded data. One or more of a plurality of decoder units in the first device are activated, where each of the plurality of decoder units is configured to operate at the same rate.

Example Embodiments

Techniques are described herein for error correction encoding and decoding operations that support multiple data rates and multiple modulation formats. For example, these techniques enable multi-rate Forward Error Correction (FEC) encoding and decoding of data, for example, at data rates of 50 gigabits per second (50 G), 100 gigabits per second (100 G) and 200 gigabits per second (200 G). The multi-rate encoding techniques described herein may be used to generate encoded data of different formats. Likewise, the multi-rate decoding techniques described herein may be used to decode encoded data of different formats.

Figure 1:
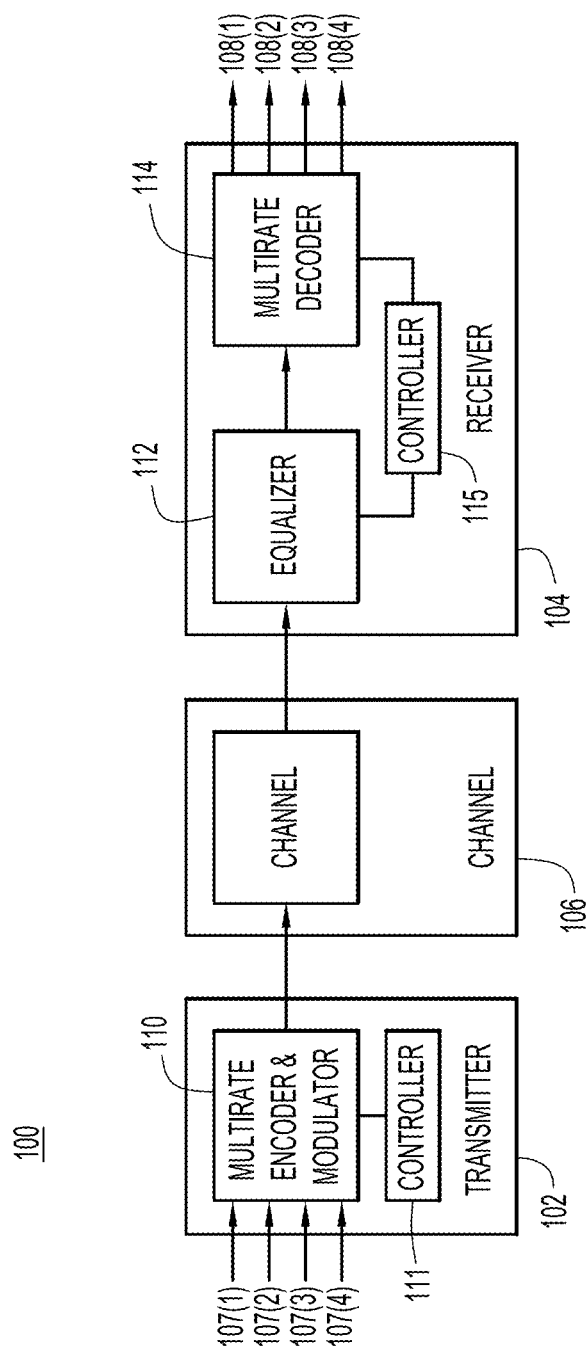
FIG. 1 is a block diagram of an example system configured to perform enhanced encoding and decoding operations of data at multiple data rates and in multiple formats, according to example embodiments.

An example system is shown in FIG. 1 at reference numeral 100. The system 100 in FIG. 1 includes a transmitter device at reference numeral 102, a receiver device at reference numeral 104 and a data channel at reference numeral 106. The transmitter device 102 may also be referred to herein as an encoder device. The transmitter device 102 is a network device that is configured to receive data at one of a plurality of input ports, represented by reference numerals 107(1)-107(4).

The transmitter device 102 is configured to perform multi-rate encoding operations. As such, FIG. 1 shows the transmitter device 102 comprising a multi-rate encoder and modulator unit 110 ("multi-rate encoder and modulator") and a controller 111. As will become apparent hereinafter, the multi-rate encoder and modulator 110 may comprise, e.g., one or more processors, one or more Application Specific Integrated Circuit (ASICs), embedded logic, etc. to perform encoding operations and modulation operations. The controller 111 is configured to instruct the multi-rate encoder and modulator 110 to perform the encoding operations and modulation operations based on, for example, the data rate of input data received by the transmitter device 102. As will become apparent hereinafter, the transmitter device 102 may receive input data at multiple data rates and may encode and modulate the data into multiple data formats. For example, the controller 111 may be a microcontroller, processor or series of processors, ASICs, etc. and memory components (e.g., random access memory (RAM), read only memory (ROM), magnetic disk storage media devices, optical storage media devices, flash memory devices, electrical, optical, or other physical/tangible (non-transitory) memory storage devices, etc.) associated with the processor(s) to instruct the multi-rate encoder and modulator 110 to perform the encoding operations and modulation operations. The functions of the controller 111 may be implemented by logic encoded in one or more tangible computer readable storage media or devices (e.g., storage devices, compact discs, digital video discs, flash memory drives, etc. and embedded logic such as an ASIC, digital signal processor instructions, software that is executed by the processor, etc.). It should be understood that the encoding operations described herein may be implemented entirely in software executed by a processor, and in such an implementation, the functions of the multi-rate encoder and modulator would be embodied by software executed by the processor. The encoding, modulation and mapping operations are described in more detail hereinafter.

In one example, the transmitter device 102 may receive 50 Gbps (G) data signals at one or more of the plurality of input ports 107(1)-107(4). In one embodiment the transmitter device 102 may be configured to receive 200 G of input data by receiving 50 G data signals at each of the four input ports 107(1)-107(4). The 200 G input data may ultimately be encoded and modulated into a data signal in a 16-ary Quadrature Amplitude Modulation (16QAM) format. The transmitter device 102 may also receive 100 G data by receiving 50 G data signals at two of the input ports. For example one 50 G data signal is received at input port 107(1) and another 50 G data signal is received at input port 107(2). In this example, input ports 107(3) and 107(4) do not receive any data signals. The 100 G data signal may ultimately be encoded and modulated into a data signal in, e.g., a Quadrature Phase Shift Keying (QPSK) format. In another example, the transmitter device 102 may be configured to receive 50 G input data by receiving a 50 G data signal at one of the four input ports (e.g., input port 107(1)). The 50 G data signal may ultimately be encoded and modulated into, for example, a data signal in a Binary Phase Shift Keying (BPSK) format. It should be appreciated that the 16QAM, QPSK and BPSK data formats described herein are merely examples. It should also be appreciated that the transmitter device 102 may receive data signals at other data rates and that these data signals may be encoded into other data formats. For simplicity, however, the encoding techniques described herein involve encoding 200 G data into a 16QAM data format, encoding 100 G data signals into a QPSK data format and encoding 50 G data signals into a BPSK data format.

The receiver device 104 is configured to receive the encoded and modulated data transmitted over the channel 106 by the transmitter device 102. The receiver device 104 is configured to receive the encoded 200 G 16QAM signal, the encoded 100 G QPSK signal and/or the encoded 50 G BPSK signal. The receiver device 104 is configured to equalize and decode the received signal. Additionally, the receiver device 104 is configured to output the decoded data via one or more of a plurality of output ports. The output ports are represented at reference numerals 108(1)-108(4).

The receiver device 104 is configured to perform multi-rate equalizing and decoding operations. As such, FIG. 1 shows the receiver device 104 includes an equalizer unit 112 ("equalizer") and a multi-rate decoder unit 114 ("multi-rate decoder") and a controller 115. The equalizer 112, in general, is a processor (e.g., ASIC, embedded logic, etc.) that is configured to receive the encoded data signal from the transmitter device 102 via the channel 106 and to remove any noise or other distortions in the encoded data signal that may have resulted from transmission in the channel 106. The encoded data signal, after being equalized, may be referred to herein as an equalized encoded data signal. The multi-rate decoder 114 is a processor or series of processors that is configured to decode the equalized encoded data signal and to minimize or eliminate transmission errors.

The controller 115 is configured to control the multi-rate decoder 114 to decode the equalized encoded data signal based on the data rate of the encoded data signal. For example, the controller 115 may take a form similar to that described above for controller 111 in the transmitter 102. Furthermore, the functions of the controllers 111 and 115 may be consolidated into one controller. It should be appreciated that the decoding operations performed by the decoder 114 may be implemented in software that is executed by a processor. It should be further appreciated that the controller 111 is configured to enable the encoding operations, as described herein, and that the controller 115 is configured to enable the decoding operations, as described herein.

In one example, the receiver 104 is configured to receive the 200 G 16QAM encoded signal (referred to herein as "16QAM signal," "16QAM data" and/or "16QAM encoded data") from the transmitter device 102 via the channel 106. Upon receiving the 16QAM signal, the receiver device 104 is configured to equalize the 16QAM signal and to decode the 16QAM signal into four 50 G data signals, each of which is outputted (e.g., to another device not shown in FIG. 1) at one of the output ports 108(1)-108(4). In another example, the receiver device 104 is configured to receive the 100 G QPSK encoded data signal (referred to herein as "QPSK signal," "QPSK data" and/or "QPSK encoded data") from the transmitter device 102 via the channel 106. Upon receiving the QPSK signal, the receiver device 104 is configured to equalize the QPSK signal and to decode the QPSK signal into two 50 G data signals. The two 50 G data signals are outputted at two of the output ports (e.g., output port 108(1) and output port 108(2)). Also the receiver 104 is configured to receive the 50 G BPSK encoded data signal (referred to herein as "BPSK signal," "BPSK data" and/or "BPSK encoded data") from the transmitter device 102 via the channel 106. Upon receiving the BPSK signal, the receiver device 104 is configured to equalize the BPSK signal and to decode the BPSK signal into a single 50 G data signal, which is outputted at one of the output ports (e.g., output port 108(1)).

The channel 106 is a data channel (e.g., a communication path between the transmitter device 102 and the receiver device 104 that enables encoded data to be sent between the transmitter device 102 and the receiver device 104). As the encoded data is sent between the transmitter device 102 and the receiver device 104, noise and/or other distortions may be imposed on the encoded and modulated data signal. Thus, the receiver device 104 equalizes the received encoded and modulated data signal upon receiving it from the transmitter device 102 via the channel 106. The channel 106 may be an optical channel, wired channel (cable, Ethernet, etc.) or a wireless channel.

In general, traditional encoding techniques enable information (data signals) to be exchanged over noisy communication channels. For example, a transmitter device may add redundant digital bits to bit streams of data as the data are exchanged over the communication channel. The purpose of adding the redundant bits is to enable errors in the data signals to be corrected without retransmission. When a receiver device receives the data signals, the receiver device is able to detect errors and correct these errors in the data signals without requesting a retransmission of the original data signal. The errors typically are visible to the receiver device after demodulation/decoding of the data signals, and the root cause of such errors is typically noise and other distortions in the encoded data signal that may have occurred during transmission of the data signals. These errors may not be compensated for by an equalizer. FEC encoding techniques are an example of redundancy encoding techniques and FEC decoding enables the receiver device to obtain the original data signal by correcting any errors that may have resulted during transmission of the FEC encoded data signal.

As stated above, the encoding operations may result in data signals being generated in accordance with particular data rates and modulation formats. For example, as the transmitter device encodes data, the transmitter device uses a modulation scheme. The modulation may involve phase shift keying, where a finite number of phases are used to represent a unique pattern of binary values. Each pattern of binary values is used to form a particular symbol that is associated with the phase of the digital data. In other words, when the transmitter device is using phase shift keying modulation, the phase of the data signal itself may be used by a receiver device to identify the data. In another example, changes or differences in phases may be used by a transmitter to encode the data and by a receiver to identify the original data. Such techniques are called differential encoding.

Phase shift keying modulation schemes are typically represented by constellation diagrams, which show points in a complex plane (i.e. with an axis representing real numbers ["real axis"] and an axis representing imaginary numbers ["imaginary axis"]). The real axis is also referred to as an "in-phase" axis, and the imaginary axis is referred to as a "quadrature axis." The amplitude of points in the constellation diagrams are modulated along each axis (e.g., via a sinusoidal wave). BPSK signals use two phases and QPSK signals use four phases. Thus, during differential encoding and decoding, the number of possible phase state transitions for BPSK signals is $2^2$, and for QPSK signals, the number of possible phase state transitions is $4^2$. As stated above, the BPSK format, e.g., is used to encode 50 G signals, while the QPSK format is used to encode 100 G signals.

QAM signals use amplitude modulation techniques to represent data. For example, when QAM is used, the amplitude of two waves in a quadrature relationship (i.e., 90 degrees out-of-phase with each other) is modulated to represent data. QAM schemes are also represented by constellation diagrams, and for 16QAM, 16 complex-valued amplitude points are represented in a constellation diagram. Thus, the number of possible amplitude state transitions for differentially encoded 16QAM is $16^2$. As is apparent, the number of possible state transitions (changes) increases quadratically from BPSK to QPSK to 16QAM formats.

As explained above, FEC encoding is a useful encoding technique which adds redundancy. However, current encoding and decoding devices are not configured to perform efficient multi-rate FEC encoding and decoding for BPSK, QPSK and 16QAM data signals. That is, existing techniques involve deploying individual encoder units on encoding devices and individual decoder units on decoder devices to handle each one of the BPSK, QPSK and 16QAM formats. However, although deploying these individual encoder and decoder units enables encoder devices and decoder devices to handle multi-rate data in different modulation formats, the encoder devices and decoder devices consume significant space and power to operate each of the dedicated encoder units and decoder units for BPSK, QPSK and 16QAM signals.

The techniques described herein alleviate these drawbacks by enabling enhanced selective multi-rate differential FEC encoding and FEC decoding for different formats. In other words, these techniques enable multi-rate differential encoding and turbo differential decoding for BPSK, QPSK and 16QAM signals. In general, turbo differential decoding is an iterative decoding technique, where the decoder operations at a decoder device iterate between soft differential decoding operations and soft-FEC decoding operations. It should be appreciated that the concept of turbo differential decoding is understood by one with ordinary skill in the art. The techniques described herein result in significant performance enhancements for encoder devices and decoder devices when compared to existing encoding and decoding techniques. For example, the techniques described herein enable encoder devices and decoder devices to consume minimal power while processing data signals at multiple data rates and of multiple data formats. In one example, the techniques described herein enable encoder devices and decoder devices to consume less power than existing devices.

Reference is now made to FIGS. 2A-2C. FIGS. 2A-2C show a first example system configured to encode data at multiple data rates in multiple formats, but using the select ones of a plurality of processing elements deployed in the encoder device. FIG. 2A shows the transmitter device 102 (encoder device) configured to receive 200 G input data (four 50 G data signals). FIG. 2B shows the transmitter device 102 configured to receive 100 G data (two 50 G data signals), and FIG. 2C shows the transmitter device 102 configured to receive 50 G data (one 50 G data signal).

In FIGS. 2A-2C, the transmitter device 102 has a plurality of encoder units 202(1)-202(4). The encoder units 202(1)-202(4) are FEC encoder units ("FEC encoders"), and each of the FEC encoders is configured to operate at the same data rate (e.g., 50 G). Encoder unit 202(1) is referred to as FEC encoder 1, encoder unit 202(2) is referred to as FEC encoder 2, and so on. The transmitter device 102 activates (e.g., via the controller 111) one or more of the FEC encoders 202(1)-202(4) depending on the input data. It should be appreciated that the FEC encoders 202(1)-202(4) could also be realized by a single encoder component in a time-sharing manner, for example, if each of the FEC encoders 202(1)-202(4) implements identical encoders. Though this implementation might not directly reduce the power dissipation of the FEC encoders 202(1)-202(4) (since the single component would operate, for example, at twice or quadruple the speed of a single FEC encoder), such an implementation may reduce the overall complexity and space on an Application Specific Integrated Circuit (ASIC).

For example, as shown in FIG. 2A, the transmitter device 102 receives four 50 G data signals, and thus, the transmitter device 102 activates all of the FEC encoders 202(1)-202(4). In this example, each of the FEC encoders 202(1)-202(4) operates at the 50 G data rate to perform FEC encoding on the 50 G data. Thus, the output of each of the FEC encoders 202(1)-202(4) is an FEC encoded 50 G data signal.

In FIG. 2B, the transmitter device 102 receives two 50 G data signals, and thus, the transmitter device 102 activates two of the FEC encoders (e.g., FEC encoder 1 and FEC encoder 2). The other two FEC encoders are not activated. FEC encoder 1 and FEC encoder 2 each perform FEC encoding on their respective 50 G data signals. Likewise, in FIG. 2C, the transmitter device 102 receives one 50 G data signal, and as a result, the transmitter device 102 activates only one of the FEC encoders (e.g., FEC encoder 1) to perform FEC encoding on the 50 G data signal. In this example, the other three FEC encoders are not activated.

FIGS. 2A-2C also show the transmitter device having a Differential Encoder (DE) 16QAM Modulator ("DE-16QAM modulator") 204. The DE-16QAM modulator 204 has four inputs, shown at 206(1)-206(4), and is configured to receive data at one or more of the inputs 206(1)-206(4). For example, in FIG. 2A, the DE-16QAM modulator 204 is configured to receive four FEC encoded 50 G data signals at the inputs 206(1)-206(4) since all four FEC encoders 202(1)-202(4) are active. In FIG. 2B, the DE-16QAM modulator 204 is configured to receive two FEC encoded 50 G data signals at two of the inputs (e.g., input 206(1) and 206(2)) since two FEC encoders are active. That is, as shown in FIG. 2B, the DE-16QAM modulator 204 receives FEC encoded data at inputs 206(1) and 206(2) and has as an input value of "1" set at inputs 206(3) and 206(4), since FEC encoders 202(3) and 202(4) are deactivated. In FIG. 2C, the DE-16QAM modulator 204 is configured to receive one FEC encoded 50 G data signal, e.g., from FEC encoder 202(1) and consequently the inputs 206(3) and 206(4) are set to a value of "1" and input 206(1) is duplicated onto the input 206(2) since FEC encoders 202(2)-202(4) are inactive.

In general, the DE-16QAM modulator 204 is able to perform several operations, e.g., at the instruction of the controller 111. For example, the DE-16QAM modulator 204 is able to perform differential encoding operations on the FEC encoded data signals. In FIG. 2A, the DE-16QAM modulator 204 is able to perform differential encoding operations on the four 50 G FEC encoded signals (output by FEC encoders 202(1)-202(4)). Likewise, in FIG. 2B, the DE-16AQM Modulator 204 is able to perform differential encoding operations on the two 50 G FEC encoded signals (e.g., output by FEC encoders 202(1) and 202(2)), and in FIG. 2C, the DE-16QAM modulator 204 is able to perform differential encoding operations on one of the 50 G FEC encoded signals (e.g., output by FEC encoder 202(1)). For example, as described above, by inserting a value of "1" at input 206(3) and 206(4), the DE-16QAM modulator 204 automatically produces QPSK output. By additionally duplicating the input 206(1) onto the input 206(2), the DE-16QAM modulator 204 produces BPSK output. Thus, the transmitter device 102 is able to perform encoding operations on the input data by performing first encoding operations (FEC encoding operations) on 50 G data signals at the FEC encoders and by performing second encoding operations (differential encoding operations) on one or more streams of FEC encoded data signals to produce an encoded output stream.

The DE-16QAM modulator 204 is also configured to perform modulation and mapping operations to modulate the encoded output stream. For example, the DE-16QAM modulator 204 is configured to modulate the encoded output stream into a 16QAM format, as shown in FIG. 2A, a QPSK format, as shown in FIG. 2B and a BPSK format, as shown in FIG. 2C. During modulation, transitions between bit values of the encoded output stream are mapped. That is, as stated above, BPSK signals typically have $2^2$ possible state transitions, QPSK signals typically have $4^2$ possible state transitions and 16QAM signals typically have $16^2$ possible state transitions. Since the DE-16QAM modulator 204 is configured to modulate the encoded output stream into either the BPSK, QPSK or 16QAM format, the DE-16QAM modulator 204 only needs to monitor 16 states with 256 possible transitions for the highest-computational scenario (e.g., for 200 G 16QAM signals). When the DE-16QAM modulator 204 is modulating signals into either the BPSK or QPSK format, the power consumption of the DE-16QAM modulator 204 is reduced, and less power is consumed by the transmitter device 102.

Figure 3A:
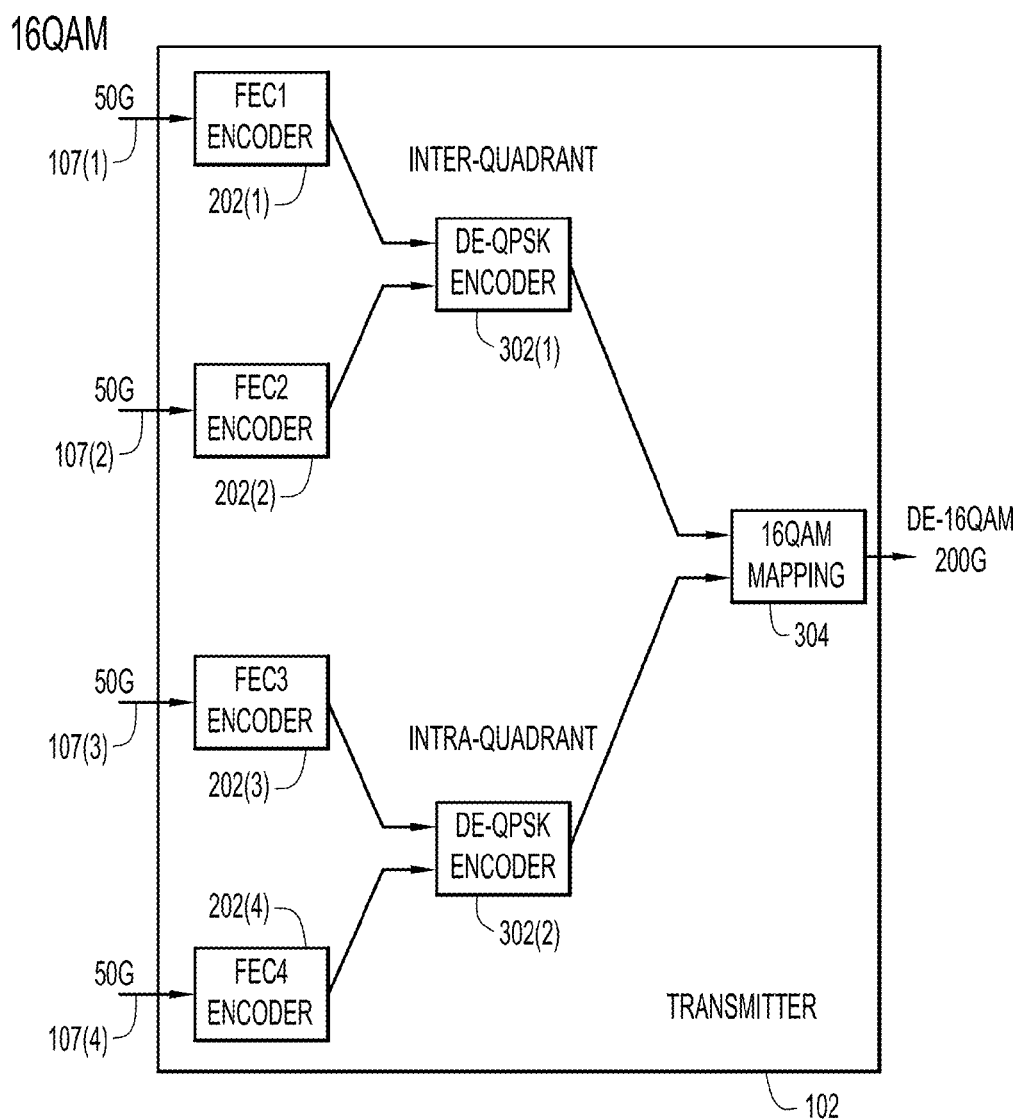
FIGS. 3A-3C are block diagrams of a second example encoding system configured to encode the data at multiple data rates in multiple formats, according to example embodiments.
Figure 3B:
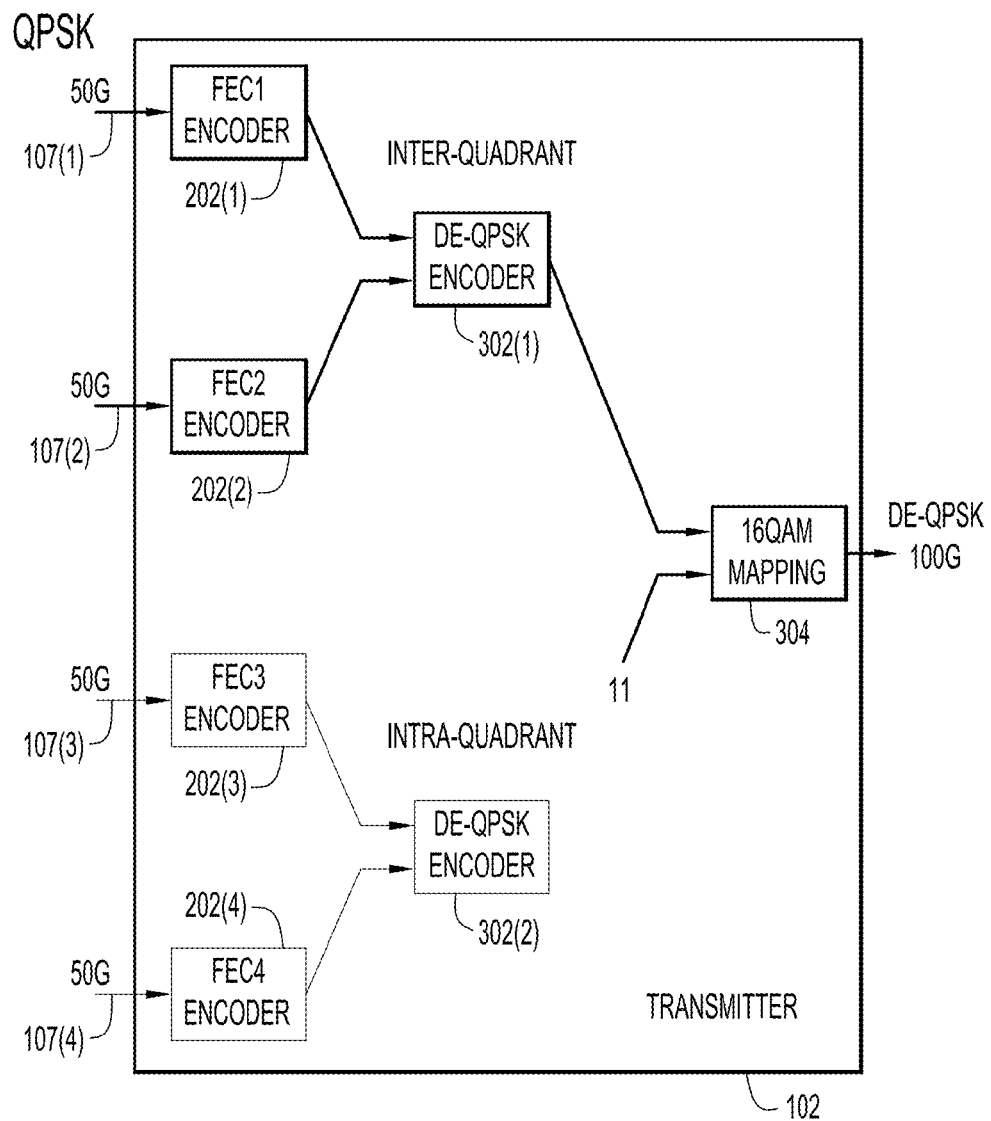
Figure 3C:
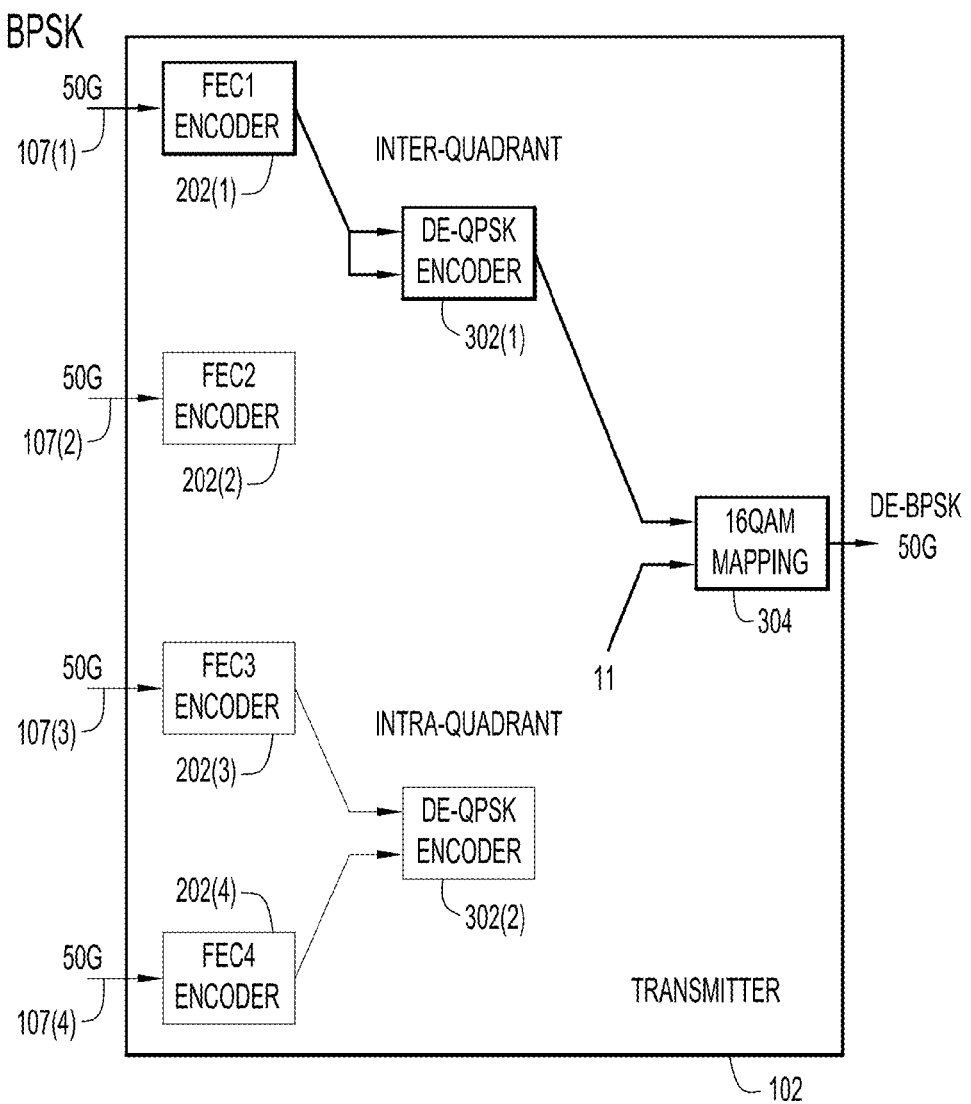

Reference is now made to FIGS. 3A-3C. FIGS. 3A-3C show a second example system configured to encode input data. As shown in FIGS. 3A-3C, the transmitter device 102 may have a plurality of FEC encoder units 202(1)-202(4), as described in connection with FIGS. 2A-2C. The transmitter device 102 is configured to receive input data at various data rates (e.g., 200 G in FIG. 3A, 100 G in FIG. 3B and 50 G in FIG. 3C). The FEC encoder units 202(1)-202(4) are selectively activated based on the input data rate, as described in connection with FIGS. 2A-2C. The transmitter device 102 in FIGS. 3A-3C, however, comprises a plurality of differential encoder units, shown at reference numeral 302(1) and 302(2). The transmitter device 102 in FIGS. 3A-3C also has a separate 16QAM mapping unit, shown at reference numeral 304. Thus, in FIGS. 3A-3C, the differential encoding operations and the mapping operations are logically distinct operations. It should be appreciated that the FEC encoders 202(1)-202(4) could also be realized by a single encoder component in a time-sharing manner, for example, if each of the FEC encoders 202(1)-202(4) implements identical encoders. Though this implementation might not directly reduce the power dissipation of the FEC encoders 202(1)-202(4) (since the single component would operate, for example, at twice or quadruple the speed of a single FEC encoder), such an implementation may reduce the overall complexity and space on an Application Specific Integrated Circuit (ASIC).

In FIGS. 3A-3C, the differential encoding operations may be performed by one or more of the differential encoder units 302(1) and 302(2), each of which operates at the same data rate. The differential encoder units 302(1) and 302(2) are, for example, DE-QPSK encoder units. Encoder unit 302(1) is referred to hereinafter as DE-QPSK encoder 1 and encoder unit 302(2) is referred to hereinafter as DE-QPSK encoder 2. The differential encoding operations are performed by the transmitter device 102 by activating one or both of DE-QPSK encoder 1 and DE-QPSK encoder 2 based on the input data rate. For example, when the input data rate is 200 G, as in FIG. 3A, both DE-QPSK encoder 1 and DE-QPSK encoder 2 are activated, e.g., by the controller 111. Likewise, when the input data rate is 100 G, as in FIG. 3B, and when the input data rate is 50 G, as in FIG. 3C, only DE-QPSK encoder 1 is activated.

In FIG. 3A, both DE-QPSK encoder 1 and DE-QPSK encoder 2 are activated. DE-QPSK encoder 1 performs differential encoding operations on two of the four 50 G FEC encoded data (e.g., output from FEC encoders 202(1) and 202(2)), and DE-QPSK encoder 2 performs differential encoding operations on the other two 50 G FEC encoded data (e.g., output from FEC encoders 202(3) and 202(4). In FIG. 3B, only DE-QPSK encoder 1 is activated, and DE-QPSK encoder 1 performs differential encoding operations on two of the four 50 G FEC encoded data, e.g., output from FEC encoders 202(1) and 202(2). In this example, DE-QPSK encoder 2 is deactivated. In FIG. 3C, only DE-QPSK encoder 1 is activated, and DE-QPSK encoder 1 performs differential encoding operations on only one of the four 50 G FEC encoded data, e.g., output from FEC encoder 202(1). The output from FEC encoder 202(1) is duplicated to the second input of DE-QPSK encoder 1, to perform differential encoding operations for BPSK without reconfiguration of the DE-QPSK encoder itself. Thus, as shown in FIGS. 3A-3C, the transmitter device 102 performs differential encoding operations by activating, e.g., at the instruction of the controller 111, one or both of the plurality of differential encoder units (DE-QPSK encoder 1 and DE-QPSK encoder 2) based on the data rate of the input data. In general, FIGS. 3A-3C show two differential encoders (DE-QPSK encoder 1 and DE-QPSK encoder 2) each of which has 16 state transitions. This approach is less complex than the approach described in connection with FIGS. 2A-2C, where one differential encoder (DE-16QAM modulator 204) with 256 transitions is used.

The transmitter device 102 in FIGS. 3A and 3B also include the 16QAM mapping unit 304. The 16QAM mapping unit 304 is configured to perform modulation and mapping operations on the output of the differential encoder units 302(1) and 302(2). For example, the 16QAM mapping unit 304 may be a two-stage mapper that is configured to map each output of the DE-QPSK encoders at different stages. The 16QAM mapping unit 304 is configured to map the output of the DE-QPSK encoder 1 in a first mapping stage and is configured to map the output of the DE-QPSK encoder 2 in a second mapping stage. Thus, as is the case in FIG. 3A, when both DE-QPSK encoder 1 and DE-QPSK encoder 2 are active, the 16QAM is configured to perform the two-stage mapping operations. In the example of FIGS. 3B and 3C, the 16QAM mapping unit 304 receives inputs only from DE-QPSK encoder 302(1), and the inputs of the 16QAM mapping unit 304 associated with DE-QPSK encoder 2 are set to a binary value of "11". When the 16QAM mapping unit 304 performs the two-stage mapping operations in FIG. 3A, a 200 G differential encoded 16QAM output signal (e.g., "200 G 16QAM encoded data") is produced. When the 16QAM mapping unit 304 performs the two-stage mapping operation in FIG. 3B, a 100 G differential encoded QPSK output signal (e.g., "100 G QPSK encoded data") is produced, and when the 16QAM mapping unit 304 performs the two-stage mapping operation in FIG. 3C, a 50 G differential encoded BPSK output signal (e.g., "50 G BPSK encoded data") is produced. The difference between the mapping operations of FIGS. 3B and 3C from that of FIG. 3A is that in the FIGS. 3B and 3C, the second input to the 16QAM mapper 304 is forced to the value "11", whereas in FIG. 3A, the second input of the 16QAM mapper 304 is taken from the output of the DE-QPSK encoder 302(2).

Figure 4:
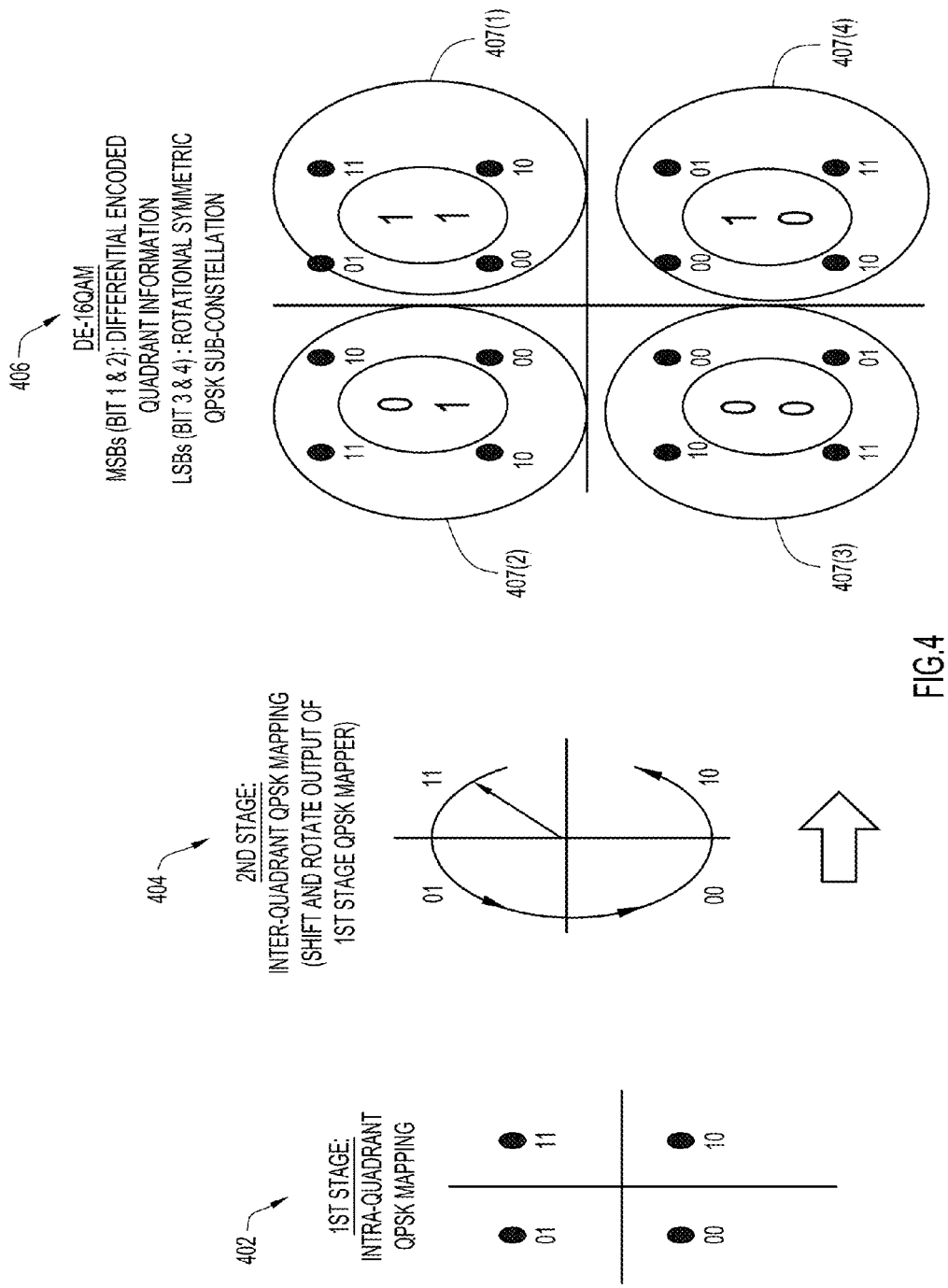
FIG. 4 shows an example representation of two-stage encoding operations performed by the second example encoding system.

Reference is now made to FIG. 4, which shows an example representation of the two-stage mapping operations performed by the 16QAM mapping unit 304 of the transmitter device 102 in FIGS. 3A-3C. In FIG. 4, the first stage of the mapping operations is shown at 402 and the second stage of the mapping operations is shown at 404. At the first stage 402, the differentially encoded symbols (representing absolute phase values) are mapped in a complex plane. During the first stage mapping operations 402, intra-quadrant QPSK mapping is performed on the first input of unit 304. In general, it should be appreciated that the first stage mapping operations 402 involve translating a binary input into in-phase amplitudes and quadrature-amplitudes in the complex plane. This can either be implemented with a look-up table or by a computation. An example computation is shown below:

Bit tuple: $b_1=0/1; b_2=0/1$

LUT:

$11 \rightarrow x_1=+1; x_Q=+1$ $01 \rightarrow x_1=-1; x_Q=+1$ $00 \rightarrow x_1=-1; x_Q=-1$ $10 \rightarrow x_1=+1; x_Q=-1$ Computation:

$x_1 = 2*b_1 - 1$ $x_Q = 2*b_2 - 1$

At the second stage mapping operations 404, inter-quadrant QPSK mapping is performed recursively such that the symbols from the first stage are shifted and rotated into a quadrant depending on the second input of 304. The result is a differential encoded 16QAM signal, whose symbols in the complex plane are shown at reference numeral 406. As seen in reference numeral 406, each quadrant of the complex plane includes a sub-constellation of symbols, and the sub-constellation of symbols is rotated as shown at reference numeral 404. That is, at reference numeral 406 in FIG. 4, the intra-quadrant constellation (represented by the larger circles 407(1)-407(4)) show the mapping of the first mapping stage 402, and the outer inter-quadrant constellation (represented by the grey circles) is mapped with the phase shift rotations shown at reference numeral 404. Moreover, when generating the differentially encoded stream, the most significant bits (MSBs) of the first QPSK mapping output (bits 1 and 2) is used as the differential encoded quadrant information, and the least significant bits (LSBs) of the second QPSK mapping output (bits 3 and 4) are used for defining a rotational symmetric QPSK sub-constellation. In one example, by forcing the second input of the 16QAM mapper 304 to "11", only the four outermost corners of the 16QAM constellation are generated. The first stage mapper receives the "11" input and generates the upper right symbol. Thus, for example, for a 100 G QPSK signal, the QPSK constellation is generated by the second stage mapping.

Figure 5A:
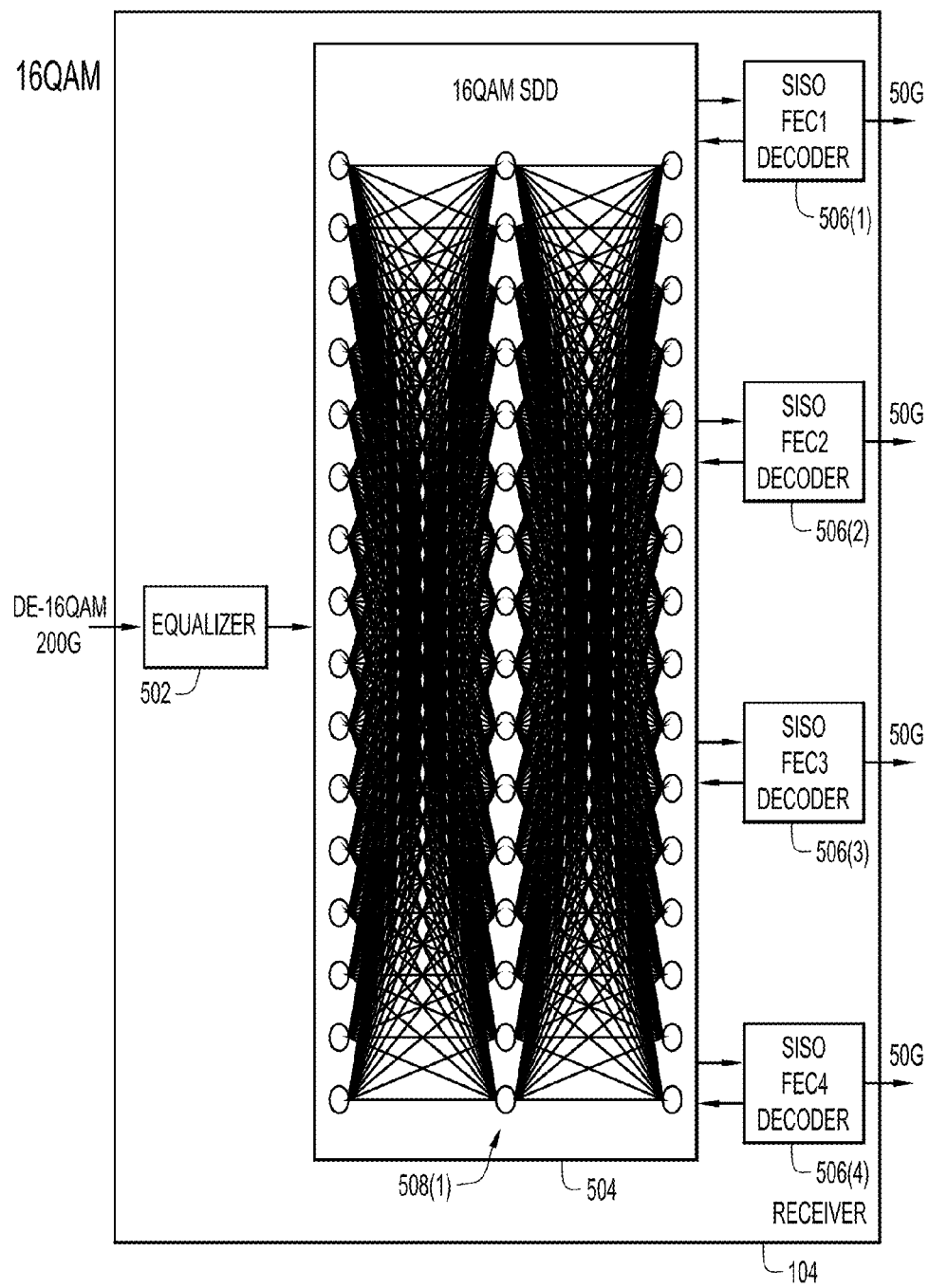
FIGS. 5A-5C are block diagrams of a first example system configured to decode encoded data of different encoding formats and of different data rates, according to example embodiments.
Figure 5B:
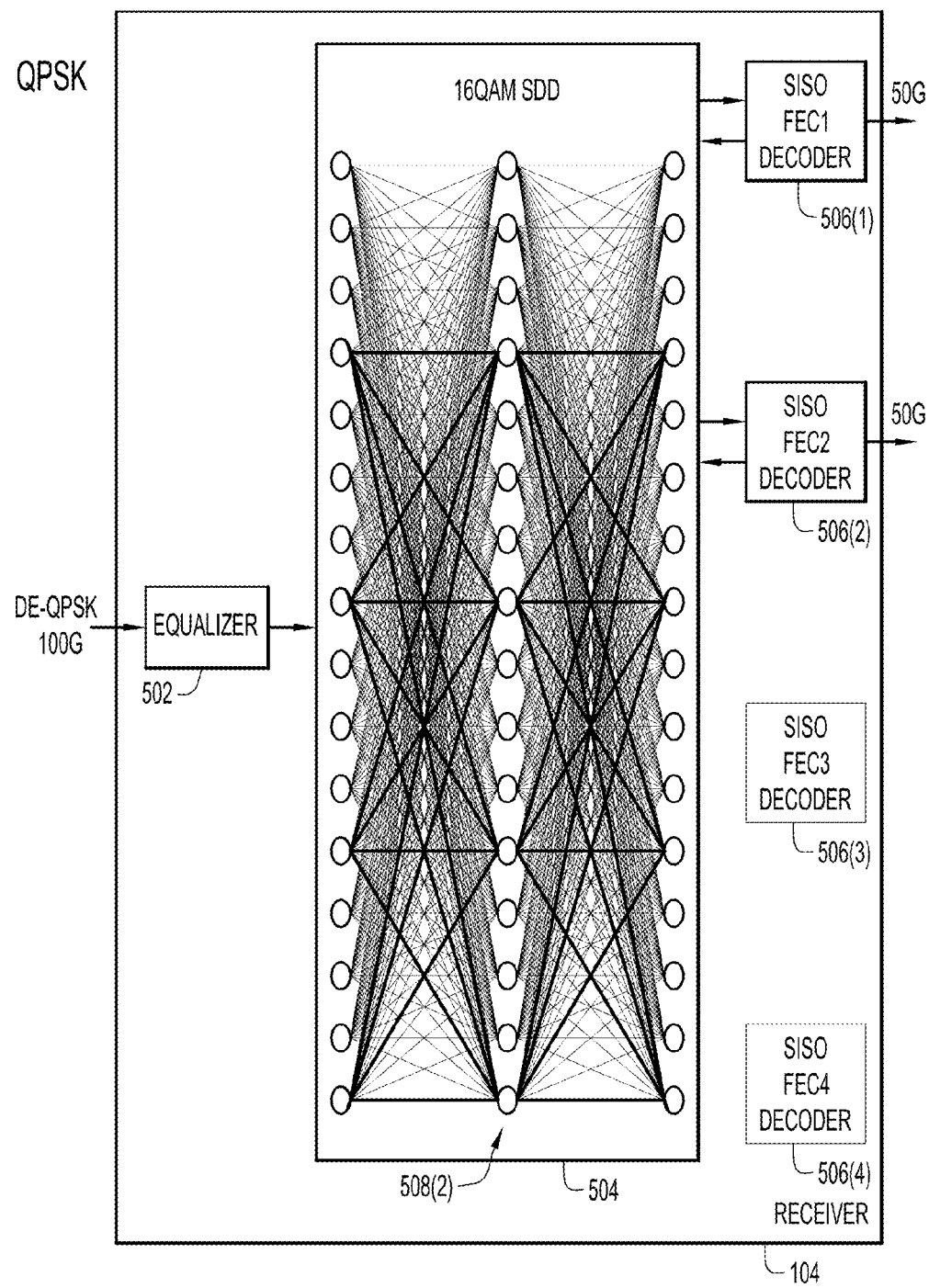
Figure 5C:
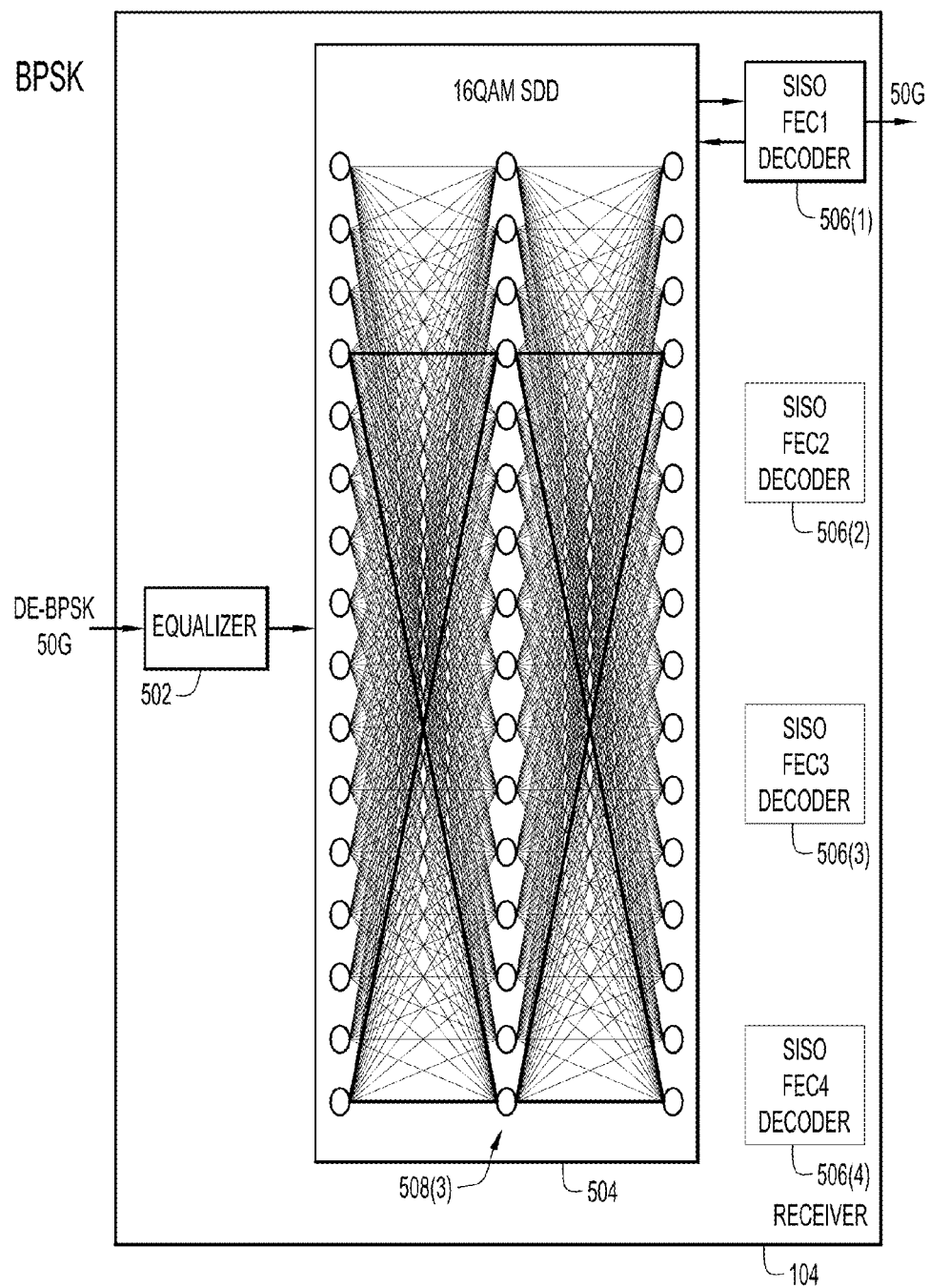

Reference is now made to FIGS. 5A-5C. FIGS. 5A-5C show a first example system configured to decode the encoded data signals of different encoding formats and of different data rates. FIGS. 5A-5C show the receiver device 104 comprises an equalizer unit 502, a soft-input soft-output (SISO) differential decoder unit 504, and a plurality of soft-input soft-output (SISO) FEC decoder units ("FEC decoders") 506(1)-506(4). It should be appreciated that the FEC decoders 506(1)-506(4) together with the differential decoder unit 504 may form a turbo differential decoder unit, as is understood by one with ordinary skill in the art.

As stated above, the receiver device 104 is configured to receive encoded (and modulated) data signals via the channel 106 from the transmitter device 102. For example, the receiver device 104 is configured to receive a differentially encoded 200 G 16QAM signal, as shown in FIG. 5A, a differentially encoded 100 G QPSK signal, as shown in FIG. 5B or a differentially encoded 50 G BPSK signal, as shown at FIG. 5C. Upon receiving the encoded data signal across the channel 106, the equalizer 502 removes noise or distortions imposed on the encoded data signals by the channel 106. The equalized encoded data signals are then supplied to the differential decoder unit 504.

The differential decoder unit 504 is shown as a SISO 16QAM differential decoder (SDD) unit ("SISO 16QAM differential decoder") in FIGS. 5A-5C. The SISO 16QAM differential decoder 504 is configured to decode the equalized encoded data of a plurality of formats and data rates. For example, as shown in FIG. 5A, the 16QAM differential decoder 504 is configured to decode 200 G 16QAM encoded data signals. Additionally, as shown in FIG. 5B, the 16QAM differential decoder 504 is configured to decode 100 G QPSK encoded data signals, and as shown in FIG. 5C, the 16QAM differential decoder 504 is also configured to decode 50 G BPSK encoded data signals.

FIGS. 5A-5C show trellis representations at 508(1)-508(3) at the 16QAM differential decoder 504. The 16QAM differential decoder 504 uses trellis decoding to recover the encoded information of the equalized encoded data. In order to recover the original information in the encoded data, the receiver device 104 exploits the redundancies in the encoded data. The 16QAM differential decoder 504 uses trellis-based differential decoding on the equalized encoded data. The trellis representations at 508(1)-508(3) depict the possible state transitions in the encoded data. For example, the trellis representation 508(1) in FIG. 5A shows 16 possible states of the 200 G 16QAM encoded data, with $16^2$ (256) possible transitions between the states. The trellis representation 508(2) in FIG. 5B also shows 16 possible states too, but since the receiver device 104 in FIG. 5B is decoding 100 G QPSK encoded data, 240 of the 256 possible transitions between the states are excluded (e.g., path transitions are forced to zero), thus leaving 16 possible transitions (in accordance with QPSK standards). In FIG. 5C, the trellis representation 508(3) also shows 16 possible states, but since the receiver device 104 in FIG. 5C is decoding 50 G BPSK encoded data, 252 out of the 256 possible transitions are excluded, thus leaving four possible transitions, in accordance with BPSK standards.

The 16QAM differential decoder 504 is configured to perform (e.g., at the instruction of the controller 115) multi-rate differential decoding operations on 200 G 16QAM encoded data, as shown in FIG. 5A, on 100 G QPSK encoded data, as shown in FIG. 5B and on 50 G BPSK encoded data, as shown in FIG. 5C. The 16QAM differential decoder 504 performs differential decoding by using some or all of the possible transitions based on the data rate of the encoded data received by the receiver device 104 via the channel 106. For example, when the modulation format of the encoded data is 16QAM, all of the 256 possible transition states of the 16QAM differential decoder 504 are used. When the modulation format of the encoded data is QPSK, 16 possible transition states of the 16QAM differential decoder 504 are used. When the modulation format of the encoded data is BPSK, four possible transition states of the 16QAM differential decoder 504 are used.

As the 16QAM differential decoder 504 performs the differential decoding operations, a series of one or more of the FEC decoders 506(1)-506(4) are activated. FEC decoder unit 506(1) is also referred to hereinafter as FEC decoder 1, FEC decoder unit 506(2) is referred to hereinafter as FEC decoder 2, and so on. The FEC decoders 506(1)-506(4) are configured to perform FEC decoding operations on the output of the 16QAM differential decoder 504. In general, the FEC decoders 506(1)-506(4) are each configured to decode data at the same data rate (e.g., 50 G). Thus, as shown in FIG. 5A, for 200 G 16QAM encoded data, all four of the FEC decoders 506(1)-506(4) are activated in order to each perform FEC decoding on 50 G portions of the 200 G data. For example, each of the FEC decoders 506(1)-506(4) are configured to feed back intermediate decoding results (e.g., soft information on each bit) to the 16QAM differential decoder 504. The 16QAM differential decoder 504 repeats the differential decoding procedure in consideration of the extrinsic information that is provided by each of the FEC decoders 506(1)-506(4). The 16QAM differential decoder 504 then updates its output, and the updated output is sent to the respective FEC decoders 506(1)-506(4) for processing. Thus, each iteration between the 16QAM differential decoder 504 and the FEC decoders 506(1)-506(4) is referred to as a turbo iteration of turbo differential decoding. The 16QAM differential decoder in this example uses all 16 states and 256 transitions when decoding the 200 G equalized encoded DE-16QAM data output by the equalizer 502.

In the example of FIG. 5B, for 100 G DE-QPSK data, two of the four FEC decoders (e.g., FEC decoders 506(1) and 506(2)) are activated in order to perform the FEC decoding on two 50 G portions of the 100 G data. For this example, the DE-QPSK SDD operation can be derived by excluding 240 out of 256 transitions, by forcing certain path metrics to zero.

In FIG. 5C, only one of the FEC decoders (e.g., FEC 506(1)) is activated in order to perform FEC decoding on the 50 G DE-BPSK data. The DE-BPSK SDD operation can be derived by excluding 252 out of 256 transitions, by forcing corresponding path metrics to zero.

Figure 6A:
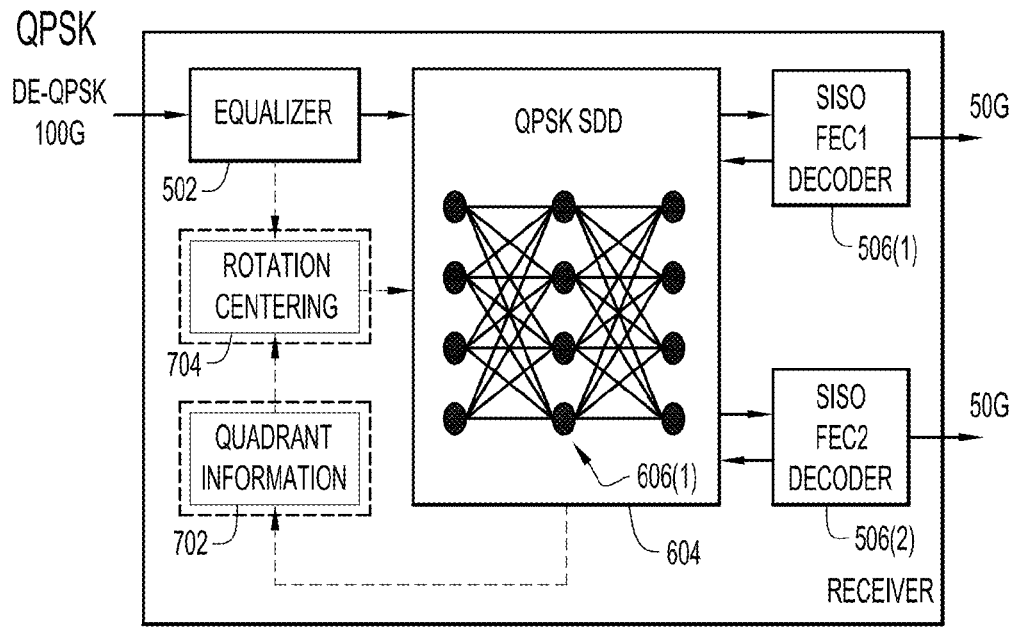
FIGS. 6A and 6B are block diagrams of a second example system configured to decode encoded data with relatively low data rates, according to example embodiments.
Figure 6B:
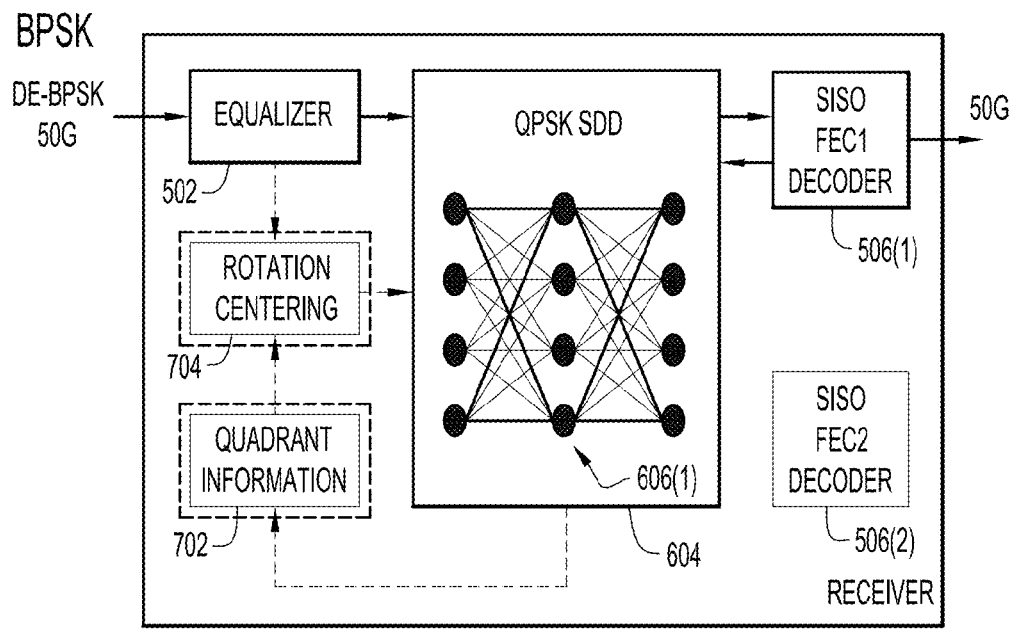

Reference is now made to FIGS. 6A and 6B. FIGS. 6A and 6B show a second example system configured to decode encoded data signals with relatively low data rates. For example, FIG. 6A shows the receiver device 104 configured to decode 100 G QPSK encoded data, and FIG. 6B shows the receiver device 104 configured to decode 50 G BPSK encoded data. In FIGS. 6A and 6B, the receiver device 104 has the equalizer 502, the DE-QPSK SDD decoder 604, and SISO FEC decoders 506(1) and 506(2). The equalizer 502 in FIGS. 6A and 6B perform the same operations as the equalizer 502 described above in connection with FIGS. 5A-5C. Also, the DE-QPSK SDD decoder 604 together with the SISO FEC decoders 506(1) and 506(2) perform similar turbo differential decoding operations as described in connection with FIGS. 5A-5C. The receiver device 104 in FIGS. 6A and 6B also has a rotation centering module 704 and a quadrant information module 702a, which are inactive in the examples depicted in FIGS. 6A and 6B, but are active in the 200 G DE-16QAM example as described below in connection with FIGS. 7A and 7B.

There is a differential decoding module 604 in the receiver device 104. The differential decoding unit 604 is shown as a QPSK SDD unit ("QPSK SISO differential decoder"). The QPSK differential decoder 604 is configured to decode the equalized encoded data at a plurality of data rates. For example, as shown in FIG. 6A, the QPSK differential decoder 604 is configured to decode 100 G QPSK encoded data signals, and as shown in FIG. 6B, the QPSK differential decoder 604 is configured to decode 50 G BPSK encoded data signals. FIGS. 6A and 6B show trellis representations at 606(1) and 606(2) of the QPSK differential decoder 604. The trellis representations 606(1) and 606(2) represent the possible state transitions in the encoded data. For example, the trellis representation in 606(1) in FIG. 6A shows four possible states of the 100 G QPSK encoded data with $4^2$ (16) possible transitions between the states. The number of possible state transitions with respect to the QPSK differential decoder 604 is significantly less than the number of possible state transitions described in connection with the 16QAM differential decoder 504 in FIGS. 5A-5C. The trellis representation 606(2) in FIG. 6B shows 16 possible transitions as well, but since the receiver device 104 in FIG. 6B is decoding only 50 G BPSK encoded data, 12 out of the 16 transitions between the states are excluded (e.g., path transitions/metrics are forced to zero), thus leaving four possible transitions, in accordance with BPSK standards.

The QPSK differential decoder 604, thus, is configured to perform multi-rate differential decoding operations on 100 G QPSK encoded data, as shown in FIG. 6A, and on 50 G BPSK encoded data, as shown in FIG. 6B. The QPSK differential decoder 604 performs differential decoding by using some or all of the possible transitions based on the data rate of the encoded data received by the receiver device 104 across the channel 106. When the encoded data is 100 G QPSK encoded data, the QPSK differential decoder 604 uses all 16 of the possible transition states to perform the differential decoding. When the encoded data is 50 G BPSK encoded data, the QPSK differential decoder 604 uses four of the 16 possible transition states to perform the differential decoding.

As the QPSK differential decoder 604 performs the differential decoding operations, one or both of FEC decoders 506(1) and 506(2) are activated to perform FEC decoding operations on the output of the QPSK differential decoder 604. That is, as shown in FIG. 6A, for 100 G QPSK decoded data, FEC decoders 506(1) and 506(2) are activated in order to each perform FEC decoding on 50 G portions of the 100 G data after the QPSK differential decoder 604 performs the decoding operations. In another example, as shown in FIG. 6B, for 50 G BPSK encoded data, only FEC decoder 506(1) is activated. FEC decoder 506(1) performs the FEC decoding on the 50 G data. It should be appreciated that each of the FEC decoders 506(1) and 506(2) are configured to feed back intermediate decoding results (e.g., soft information on each bit) to the QPSK differential decoder 604. The QPSK differential decoder 604 repeats the differential decoding procedure in consideration of the extrinsic information that is provided by each of the FEC decoders 506(1) and 506(2). The QPSK differential decoder 604 then updates its output, and the updated output is sent to the respective FEC decoders 506(1) and 506(2). Thus, each iteration between the QPSK differential decoder 604 and the FEC decoders 506(1) and 506(2) is referred to as a turbo iteration of turbo differential decoding.

Figure 7A:
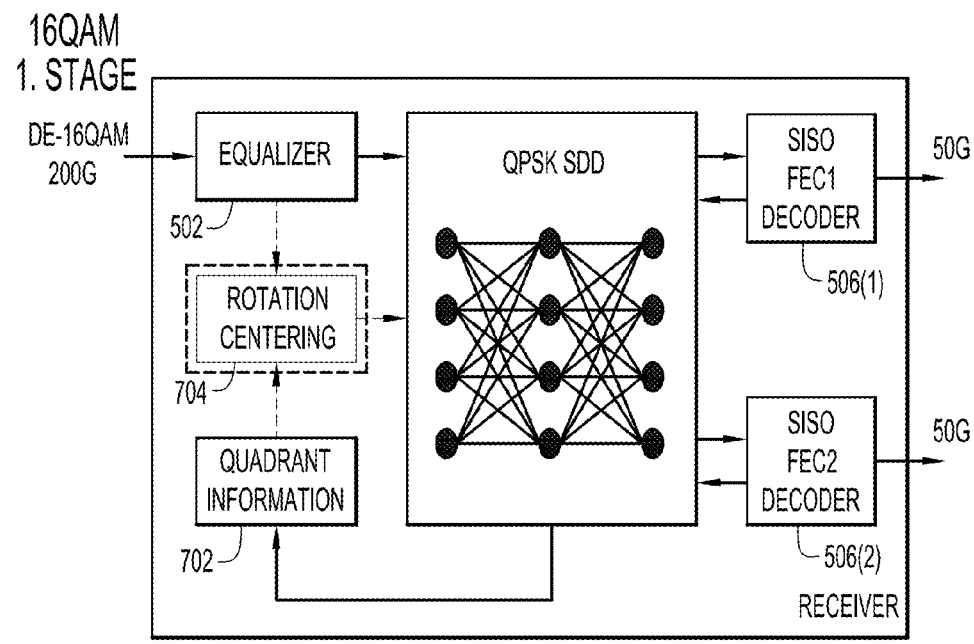
FIGS. 7A and 7B are block diagrams of the second example system configured to decode the encoded data signals with relatively high data rates, according to example embodiments.
Figure 7B:
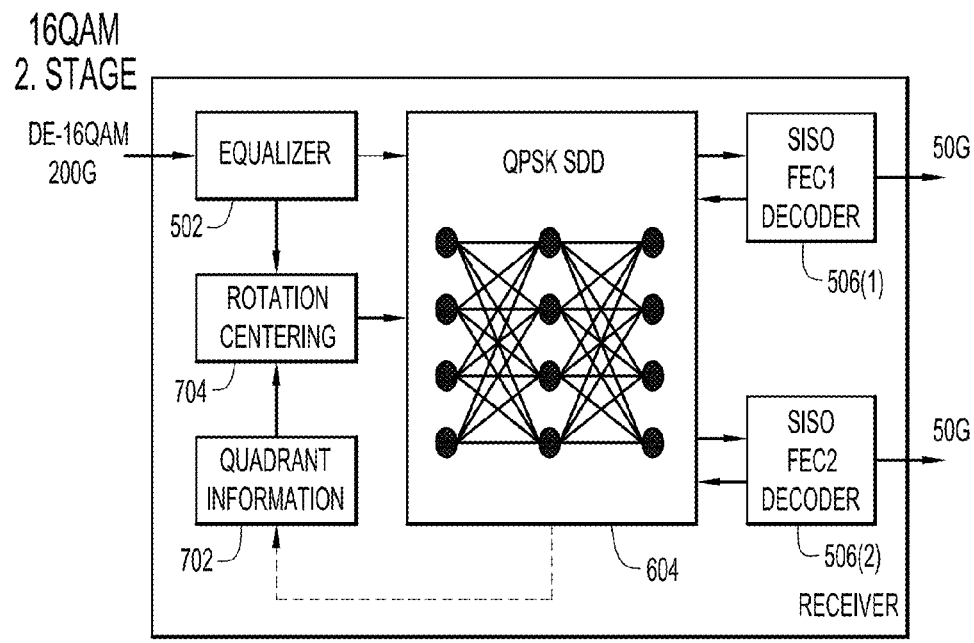

Reference is now made to FIGS. 7A and 7B. FIGS. 7A and 7B show the second example system configured to decode the encoded data signals with relatively high data rates. That is, the receiver device 104 in FIGS. 7A and 7B has the same topology as the receiver device 104 in FIGS. 6A and 6B, but with the quadrant information module 702 and rotation centering module 704. For example, FIGS. 7A and 7B each have the equalizer 502, QPSK differential decoder 604, and FEC decoders 506(1) and 506(2). The receiver device 104 in FIGS. 7A and 7B uses functions of the quadrant information module 702 and rotation centering module 704 to enable the QPSK differential decoder 604 together with the FEC decoders 506(1) and 506(2) to perform a two-stage turbo differential decoding operation. The first stage of the turbo differential decoding operation is shown in FIG. 7A in which functions of the quadrant information module 702 are used and the second stage of the differential decoding operation is shown in FIG. 7B in which output of the quadrant information module 702 is supplied to the rotation centering module 704 that performs certain functions, as described further hereinafter.

As described above in connection with FIGS. 3A-3C and FIG. 4, during encoding, the 200 G 16QAM encoded data is generated using a two-stage mapping operation. The two-stage mapping operation is, in general, performed by a first QPSK mapping operation and a second QPSK mapping operation to produce the 200 G 16QAM encoded data. The first stage of this two-stage mapping operation involves intra-quadrant QPSK mapping, and the second stage involve inter-quadrant QPSK mapping. Thus, in FIGS. 7A and 7B, the quadrant information module 702 receives input from the QPSK differential decoder 604 to determine the QPSK mapping quadrant. FIG. 7A represents the first stage of the turbo differential decoding operation, which is performed on the inter-quadrant portion of the 200 G 16QAM signal. In other words, in order to decode the inter-quadrant portion of the 200 G 16QAM signal, the 16QAM constellation is treated as if QPSK data has been transmitted. During the second stage of the turbo differential decoding operation, the rotation centering module 704 receives input from the quadrant information module 702 to rotate the intra-quadrant QPSK symbols to the appropriate quadrant. These techniques are described in more detail hereinafter in connection with FIG. 8. During the first stage of decoding operations, the QPSK differential decoder 604 decodes the inter-quadrant QPSK encoded data and exchanges iteratively the decoded inter-quadrant QPSK data with the FEC decoders 506(1) and 506(2) for turbo differential decoding. During the second stage of decoding operations, the QPSK differential decoder 604 decodes the intra-quadrant QPSK encoded data and exchanges the decoded intra-quadrant QPSK data with the FEC decoders 506(1) and 506(2) for turbo differential decoding. Thus, the QPSK differential decoder and the FEC decoders 506(1) and 506(2) are time-shared for performing the FEC turbo differential decoding operations on the inter-quadrant QPSK data and performing the FEC turbo differential decoding operations on the intra-quadrant QPSK data.

Reference is now made to FIG. 8, which shows an example diagram 800 depicting the two-stage decoding operations performed on the encoded data in FIGS. 7A and 7B. The first stage of the decoding operations is shown at reference numeral 802 in FIG. 8, and the second stage of the decoding operations is shown at reference numerals 804 and 806. As shown in reference numeral 802, the 200 G 16QAM comprises intra-quadrant QPSK constellations, shown at 808(1)-808(4) and inter-quadrant QPSK constellation 810. As stated above, the first stage of the two-stage decoding operation enables the QPSK differential decoder 604 and the FEC decoders 506(1) and 506(2) to each decode (e.g., correct) 50 G portions of the 100 G inter-quadrant QPSK data 810. The inter-quadrant symbol errors corrected in this way are shown at reference numeral 820 in FIG. 8. In an intermediate stage rotating operations are performed using a criterion for a rotate-function based on the quadrant information 702 which can be derived from the converged path metrics of the QPSK differential decoder 604. The rotated QPSK symbols shown at 804 are moved to the origin, as shown at 806, and are decoded by turbo differential decoding at the second decoding stage). The second stage of the two-stage turbo differential decoding operation enables the QPSK differential decoder 604 and the FEC decoders 506(1) and 506(2) to each decode 50 G portions of the 100 G intra-quadrant QPSK signals 808(1)-808(4). The intra-quadrant symbol errors corrected in this way are shown at reference numeral 822 in FIG. 8.

Figure 9:
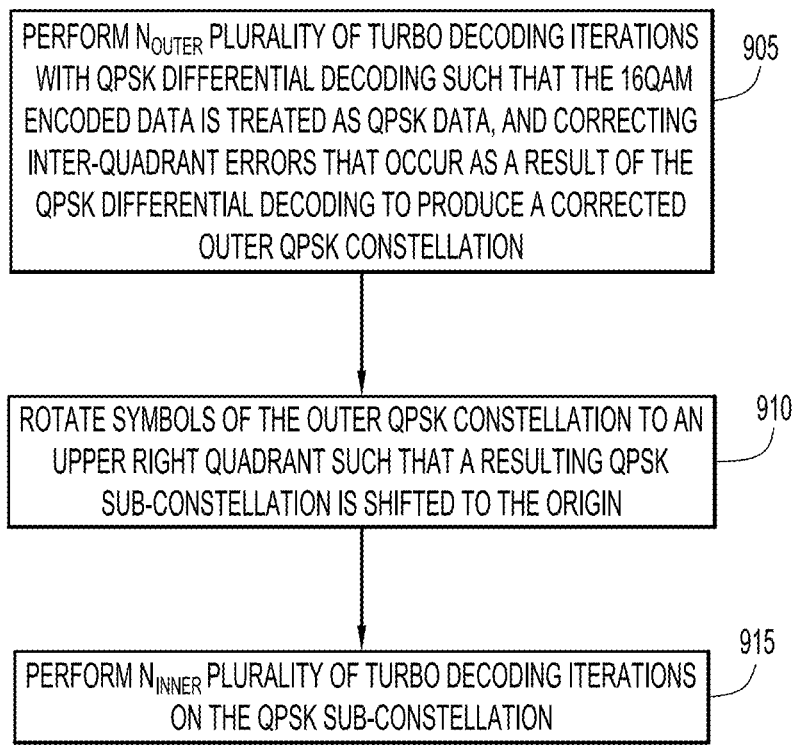
FIG. 9 shows an example flow chart depicting operations performed during the two-stage decoding process.

Reference is now made to FIG. 9, which shows an example flow chart 900 depicting operations performed during the two-stage decoding process. At 905, the receiver device 104 performs a plurality of $N_{outer}$ turbo decoding iterations with QPSK differential decoding such that the 200 G 16QAM encoded data is treated as 100 G QPSK data. The receiver device corrects inter-quadrant errors that occur as a result of the QPSK differential decoding to produce a corrected output QPSK constellation. At 910, the receiver device 104 rotates the symbols of the outer QPSK constellation to an upper right quadrant (as shown in FIG. 8 at 804) such that a resulting QPSK sub-constellation is shifted to the origin (as shown in FIG. 8 at 806). The receiver device 104 performs a plurality of $N_{inner}$ turbo decoding operations on the inner QPSK sub-constellation.

Figure 10:
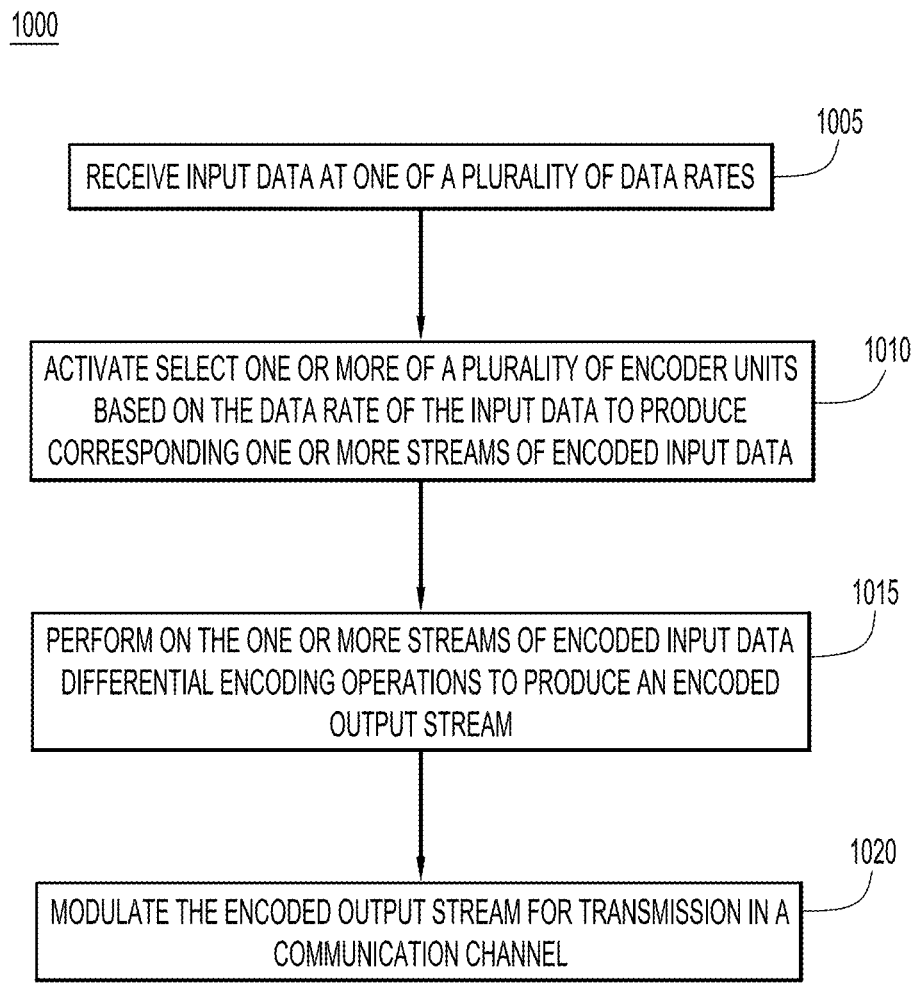
FIG. 10 shows an example flow chart depicting operations of the encoding techniques performed by an encoder unit, according to example embodiments.

Reference is now made to FIG. 10, which shows an example flow chart 1000 depicting operations of the enhanced encoding techniques described above in connection with FIGS. 2A-2B, 3A-3C and 4. The flow chart 1000 depicts operations performed by the transmitter device 102, which may also be referred to as an encoder device. At 1005, input data is received at a first device (e.g., the transmitter device 102) at one of a plurality of data rates. At 1010, one or more of a plurality of encoder units in the first device are activated based on the data rate of the input data to produce corresponding one or more streams of encoded input data. Each of the plurality of encoder units is configured to operate at the same data rate. At 1015, differential encoding operations are performed on the one or more streams to produce an encoded output stream. The encoded output stream is modulated, at 1020, for transmission in a communication channel to a second device (e.g., the receiver device 104). It should be appreciated that the encoder units may be in a quasi-static state, in that they are provisioned in an operating mode.

Figure 11:
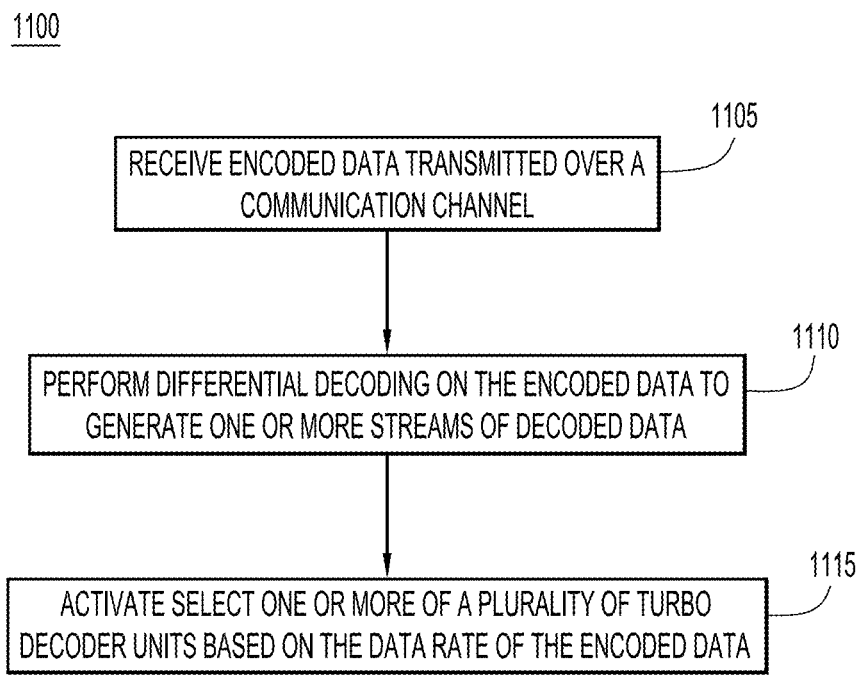
FIG. 11 shows an example flow chart depicting operations of the decoding techniques performed by a turbo differential decoder unit, according to example embodiments.

Reference is now made to FIG. 11, which shows an example flow chart 1100 depicting operations of the enhanced decoding techniques performed by a decoder unit, according to example embodiments. In general, it should be appreciated that turbo differential decoding involves iterating between a differential decoder unit and, e.g., FEC decoders. At 1105, encoded data is received at a first device over a communication channel from a second device. The encoded data stream includes encoded data at one of a plurality of data rates. At 1110, the first device performs differential decoding on the encoded data to generate one or more streams of decoded data. At 1115, the first device activates one or more of a plurality of FEC decoder units based on the data rate of the encoded data. As shown in FIG. 11, operation 1115 may feed back to operation 1110 to perform turbo differential decoding (e.g., turbo differential decoding iterating between operations 1110 and 1115).

In summary, a method is provided comprising: receiving at a first device input data at one of a plurality data rates; activating one or more of a plurality of encoder units in the first device based on the data rate of the input data to produce corresponding one or more streams of encoded input data, wherein each of the plurality of encoder units is configured to operate at a same data rate; performing on the one or more streams of encoded input data differential encoding operations to produce an encoded output stream; and modulating the encoded output stream for transmission in a communication channel to a second device.

The performing of differential encoding operations may involve receiving inputs to a differential encoder unit from output of the one or more of the plurality of encoder units which have been activated. An input to the differential encoder unit may be set to a predetermined logic value to be supplied to encoder units which have not been activated so that the differential encoder produces symbols only for the modulation format that is used.

Modulating the encoded output stream may be made according to one of a plurality of modulation formats based on the data rate of the input data, wherein the modulation formats include one or more of a Quadrature Amplitude Modulation format, a Quadrature Phase Shifting Key format or a Binary Phase Shifting Key format.

Activating may involve activating a single Forward Error Correction (FEC) encoder unit that is configured to encode data at a plurality of data rates. Alternatively, activating may involve activating one or more FEC encoder units of a plurality of FEC encoder units that are each configured to encode input data at a particular data rate.

In one form, activating may involve: activating one of the FEC encoder units if the input data has a data rate equal to the particular data rate; activating two of the FEC encoder units if the input data has a data rate of twice the particular data rate; and activating four of the FEC encoder units if the input data has a data rate of four times the particular data rate.

Modulating may involve modulating bit values of the encoded output stream and mapping transitions between bit values of the encoded output stream over time. More specifically, in one form, modulating may involve: differentially encoding the encoded output stream using a state machine with 16 states and 256 possible transitions between the 16 states; and mapping and modulating the differentially encoded output stream onto Quadrature Amplitude Modulation (QAM) symbols.

The differential encoding operations may involve activating one or more of a plurality of differential encoder units that operate at the same data rate based on the data rate of the input data to produce the encoded output stream, and further comprising performing Quadrature Amplitude Modulation (QAM) mapping of the output of the activated one or more differential encoder units. Activating the one or more of the plurality of differential encoder units may involve activating one or more Quadrature Phase Shifting Key (QPSK) differential encoder units of a plurality of QPSK differential encoder units.

Activating the QPSK encoder units may involve: activating one of the QPSK differential encoder units if the data rate of the input data is equal to a particular data rate or twice the particular data rate; and activating two of the QPSK differential encoder units if the data rate of the input data is equal to four times the particular data rate. When the data rate of the input data is equal to the particular data rate, a coupling is made to both first and second inputs of the activated one of the QPSK differential encoder units output from an activated encoder unit.

In one form, performing the QAM mapping may involve supplying to a first input of a QAM mapper unit output from the activated one of the QPSK differential encoder units and forcing a second input of the QAM mapper unit to a logic "11" value when the data rate of the input data is equal to a particular data rate or twice the particular data rate, and supplying to the first and second inputs of the QAM mapper unit outputs from respective first and second activated ones of the QPSK differential encoder units.

In another form, performing the QAM mapping may involve: performing intra-quadrant QPSK mapping to produce first QPSK mapping output; recursively performing inter-quadrant QPSK mapping by shifting and rotating the previous mapping output to produce an additional QAM mapping output; and outputting a differentially encoded stream using predetermined most significant bits of the first QPSK mapping output as differential encoded quadrant information and using predetermined least significant bits of the second QPSK mapping output for defining a rotational symmetric sub-constellation.

In addition, a method is provided comprising: receiving at a first device an encoded data stream transmitted over a communication channel from a second device, the encoded data stream including encoded data at one of a plurality of data rates; performing differential decoding on the encoded data to generate one or more streams of decoded data based on the data rate of the encoded data; and activating one or more of a plurality of Forward Error Correction (FEC) decoder units in the first device based on the data rate of the encoded data, wherein each of the plurality of FEC decoder units is configured to operate at a same rate.

Furthermore, an apparatus is provided comprising: a plurality of encoder units configured to operate at a same data rate; a controller coupled to the plurality of encoder units, and configured to selectively activate one or more of the plurality of encoder units based on a data rate of input data so as to produce corresponding one or more streams of encoded input data; and a modulator unit configured to: perform on the one or more streams of encoded input data differential encoding operations to produce an encoded output stream; and modulate the encoded output stream for transmission in a communication channel.

The modulator unit may be configured to modulate the encoded output stream according to one of a plurality of modulation formats based on the data rate of the input data, wherein the modulation formats include one or more of a Quadrature Amplitude Modulation format, a Quadrature Phase Shifting Key format or a Binary Phase Shifting Key format. The plurality of encoder units may be Forward Error Correction (FEC) encoder units that are each configured to encode input data at a particular data rate.

In one form, the controller is configured to: activate one of the FEC encoder units if the input data has a data rate equal to the particular data rate; activate two of the FEC encoder units if the input data has a data rate of twice the particular data rate; and activate four of the FEC encoder units if the input data has a data rate of four times the particular data rate.

The modulator unit may be configured to: differentially encode the encoded output stream using a state machine with 16 states and 256 possible transitions between the 16 states to produce a differentially encoded output stream; and map and modulate the differentially encoded output stream onto Quadrature Amplitude Modulation (QAM) symbols.

The modulator may include one or more of a plurality of differential encoder units that operate at the same data rate based on the data rate of the input data to produce the encoded output stream. Each of the one or more differential encoder units may be a Quadrature Phase Shifting Key (QPSK) differential encoder unit.

Additionally, an apparatus is provided comprising: a differential decoder unit configured to perform differential decoding operations at one of a plurality of data rates on received encoded data; a plurality of Forward Error Correction (FEC) decoder units configured to operate at a same data rate; and a controller configured to selectively activate one or more of the plurality of FEC decoder units based on the data rate of the encoded data.

The above description is intended by way of example only. Various modifications and structural changes may be made therein without departing from the scope of the concepts described herein and within the scope and range of equivalents of the claims.

It should be appreciated that the techniques described above in connection with all embodiments may be performed by one or more computer readable storage media that is encoded with software comprising computer executable instructions to perform the methods and steps described herein. For example, the operations performed by the transmitter device 102 and the receiver device may be performed by one or more computer or machine readable storage media (non-transitory) or device executed by a processor and comprising software, hardware or a combination of software and hardware to perform the techniques described herein.

What is claimed is:

1. A method comprising:
    receiving at a first device an encoded data stream transmitted over a communication channel from a second device, the encoded data stream including encoded data at one of a plurality of data rates;
    performing differential decoding on the encoded data to generate one or more streams of decoded data based on the data rate of the encoded data stream; and
    activating one or more of a plurality of Forward Error Correction (FEC) decoder units in the first device based on the data rate of the encoded data stream, wherein each of the plurality of FEC decoder units is configured to operate at a same data rate;
    wherein performing differential decoding comprises performing turbo differential decoding on the encoded data by iterating between a soft-input soft-output differential decoder unit and one or more of the plurality of FEC decoder units;
    wherein when the data rate of the encoded data is equal to four times a particular data rate and the modulation format of the encoded data is Quadrature Amplitude Modulation (QAM), the performing turbo differential decoding comprises:
        performing $N_{outer}$ plurality of turbo differential decoding iterations with Quadrature Phase Shift Keying (QPSK) differential decoding such that the QAM encoded data is treated as QPSK data, and correcting inter-quadrant errors that occur as a result of the QPSK differential decoding to produce a corrected outer QPSK constellation;
        rotating symbols of the outer QPSK constellation to an upper right quadrant such that a resulting QPSK sub-constellation is shifted to the origin; and
        performing $N_{inner}$ plurality of turbo differential decoding iterations on the QPSK sub-constellation.

2. The method of claim 1, wherein rotating comprises rotating using a criterion for a rotate function derived from converged path metrics of the QPSK differential decoding.

3. The method of claim 1, further comprising time-sharing a plurality of turbo decoding units for performing the $N_{outer}$ plurality of turbo decoding iterations and $N_{inner}$ plurality of turbo decoding iterations.

4. The method of claim 1, wherein activating comprises activating one or more of the plurality of Forward Error Correction (FEC) decoder units that are each configured to decode data at the same data rate.

5. An apparatus comprising:
a differential decoder unit configured to perform differential decoding operations at one of a plurality of data rates on received encoded data;
a plurality of Forward Error Correction (FEC) decoder units configured to operate at a same data rate; and
a controller configured to selectively activate one or more of the plurality of FEC decoder units based on the data rate of the encoded data;
wherein the differential decoder unit performs turbo differential decoding of the encoded data by iterating between a soft-input soft-output differential decoder unit and one or more of a plurality of FEC decoder units;
wherein when the data rate of the encoded data is equal to four times a particular data rate and the modulation format of the encoded data is Quadrature Amplitude Modulation (QAM), the differential decoder unit is a Quadrature Phase Shift Keying (QPSK) differential decoder that performs turbo differential decoding by:
performing $N_{outer}$ plurality of turbo differential decoding iterations with QPSK differential decoding such that the QAM encoded data is treated as QPSK data, and correcting inter-quadrant errors that occur as a result of the QPSK differential decoding to produce a corrected outer QPSK constellation;
rotating symbols of the outer QPSK constellation to an upper right quadrant such that a resulting QPSK sub-constellation is shifted to the origin; and
performing $N_{inner}$ plurality of turbo differential decoding iterations on the QPSK sub-constellation.

6. The apparatus of claim 5, wherein the QPSK differential decoder rotates symbols using a criterion for a rotate function derived from converged path metrics of the QPSK differential decoding.

7. The apparatus of claim 5, wherein a plurality of turbo decoding units are time-shared for performing the $N_{outer}$ plurality of turbo decoding iterations and $N_{inner}$ plurality of turbo decoding iterations.

8. The apparatus of claim 5, wherein the plurality of FEC decoder units are each configured to decode data at the same rate.

* * * * *